United States Patent
Lien et al.

(10) Patent No.: US 12,254,926 B2
(45) Date of Patent: Mar. 18, 2025

(54) MEMORY DEVICE WITH FAST WRITE MODE TO MITIGATE POWER LOSS

(71) Applicant: Micron Technology, Inc., Boise, ID (US)

(72) Inventors: Yu-Chung Lien, San Jose, CA (US); Juane Li, Milpitas, CA (US); Sead Zildzic, Jr., Folsom, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 279 days.

(21) Appl. No.: 17/817,288

(22) Filed: Aug. 3, 2022

(65) Prior Publication Data

US 2024/0046990 A1   Feb. 8, 2024

(51) Int. Cl.
 *G11C 16/10* (2006.01)
 *G11C 16/04* (2006.01)
 *G11C 16/34* (2006.01)

(52) U.S. Cl.
 CPC .......... *G11C 16/10* (2013.01); *G11C 16/0483* (2013.01); *G11C 16/3459* (2013.01)

(58) Field of Classification Search
 CPC . G11C 16/10; G11C 16/0483; G11C 16/3459; G11C 16/32; G11C 11/5628
 USPC .................................................... 365/185.22
 See application file for complete search history.

(56) References Cited

U.S. PATENT DOCUMENTS

| | | | |
|---|---|---|---|
| 2021/0134813 A1* | 5/2021 | Moon | H01L 28/91 |
| 2021/0264980 A1* | 8/2021 | Sagron | G06F 11/1068 |
| 2023/0112849 A1* | 4/2023 | Kim | H01L 25/18 |
| | | | 365/185.03 |

FOREIGN PATENT DOCUMENTS

| | | | | |
|---|---|---|---|---|
| CN | 114664834 A | * | 6/2022 | H01L 28/90 |
| JP | 2008522322 A | * | 6/2008 | |
| WO | WO-2021107988 A1 | * | 6/2021 | G06F 16/2322 |

\* cited by examiner

*Primary Examiner* — Fernando Hidalgo
(74) *Attorney, Agent, or Firm* — Harrity & Harrity, LLP

(57) ABSTRACT

Implementations described herein relate to a memory device with a fast write mode to mitigate power loss. In some implementations, the memory device may detect a condition associated with power supplied to the memory device. The memory device may detect one or more pending write operations to be performed to cause data to be written to memory cells of the memory device. The memory device may switch from a first voltage pattern, previously used by the memory device to write data to one or more memory cells of the memory device, to a second voltage pattern based on detecting the condition and based on detecting the one or more pending write operations. The memory device may perform at least one write operation, of the one or more pending write operations, using the second voltage pattern.

25 Claims, 12 Drawing Sheets

MEMORY DEVICE WITH FAST WRITE MODE TO MITIGATE POWER LOSS

TECHNICAL FIELD

The present disclosure generally relates to memory devices, memory device operations, and, for example, to a memory device with a fast write mode to mitigate power loss.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Endurance and performance are important factors for memory device design and operation. Often, these factors compete with one another. For example, an increase in performance may reduce endurance (e.g., a lifespan of the memory device), and performing operations in a manner that extends endurance may result in poorer performance. As a more specific example, the endurance impact of a memory write operation and a write time for the memory write operation may depend on a voltage pattern used to write data to memory cells. A voltage pattern is a variation in voltage over time, and a write voltage pattern is a variation, over time, in a voltage applied to one or more access lines to write to memory cells.

A "fast write voltage pattern" may enable a faster write time than a "slow write voltage patten," but the fast write voltage pattern may result in a greater reduction in the lifespan of a memory device, as compared to the slow write operation, to achieve that faster write time. Conversely, writing to memory using a slow write voltage pattern may result in a smaller reduction in the lifespan of a memory device as compared to a fast write voltage pattern, but the slow write voltage pattern may result in a slower write time than the fast write voltage pattern. For example, a memory device may have a longer lifespan, as measured by a number of program-erase (P/E) cycles, if the memory device uses a slow write voltage pattern rather than a fast write voltage pattern.

For some systems, like data center solid state drives (SSDs) that are expected to have a long lifespan, it may be more desirable to use a slow write voltage pattern to increase endurance of the system (as compared to a fast write voltage pattern). The slow write voltage pattern may result in data loss in situations where a power supply to a memory device is unstable (e.g., there is or will likely be an upcoming power loss) and there are pending write operations to be performed by the memory device.

Some implementations described herein enable a memory device to select and use a type of write voltage pattern based on one or more conditions detected by the memory device, such as a condition associated with power supplied to the memory device (e.g., a condition indicative of an unstable power supply, a power supply problem, and/or an upcoming power loss). Although maintaining and using multiple write voltage patterns and selecting a write voltage pattern to use under different conditions may increase system complexity, this enables faster write times in scenarios where performance is more important than high endurance, while also increasing endurance (e.g., a lifespan) of the memory device by using slower write times in scenarios where performance is less important than endurance. Furthermore, when an upcoming power loss is detected, switching to the fast write voltage pattern may prevent or reduce data loss.

Figure 1:
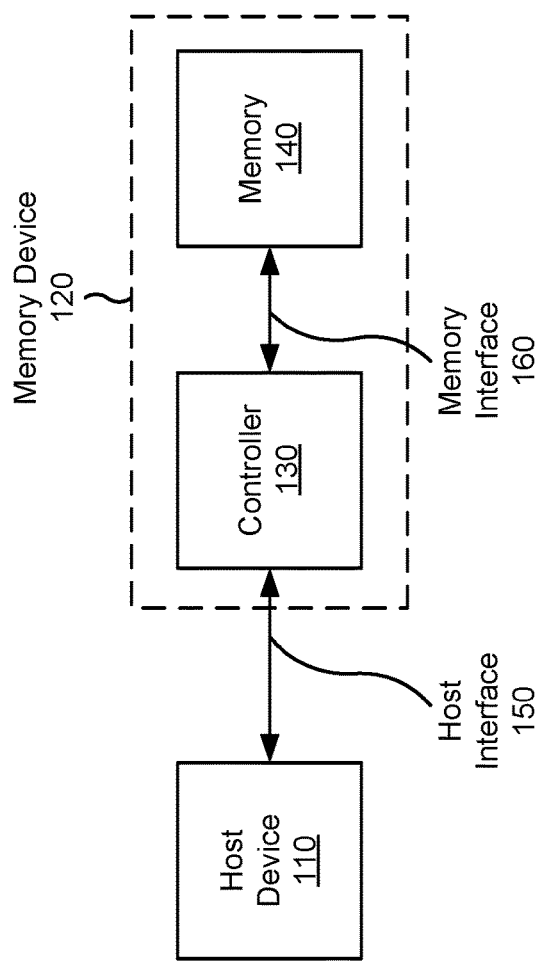
FIG. 1 is a diagram illustrating an example system capable of enabling a fast write mode to mitigate power loss.

FIG. 1 is a diagram illustrating an example system 100 capable of enabling a fast write mode to mitigate power loss. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to activate a fast write mode, that uses a fast write voltage pattern to write data to the memory device 120, based on detecting a condition associated with power supplied to the memory device 120 (e.g., a power supply problem or an upcoming power loss). For example, the memory device 120 may switch from a slow write voltage pattern to a fast write voltage pattern based on detecting the condition. This may enable faster write times under conditions where high performance is important. Furthermore, this may enable high endurance for the memory device 120 by using slower write times under conditions where high performance is not as important.

As indicated above, FIG. 1 is provided as an example. Other examples may differ from what is described with regard to FIG. 1.

Figure 2:
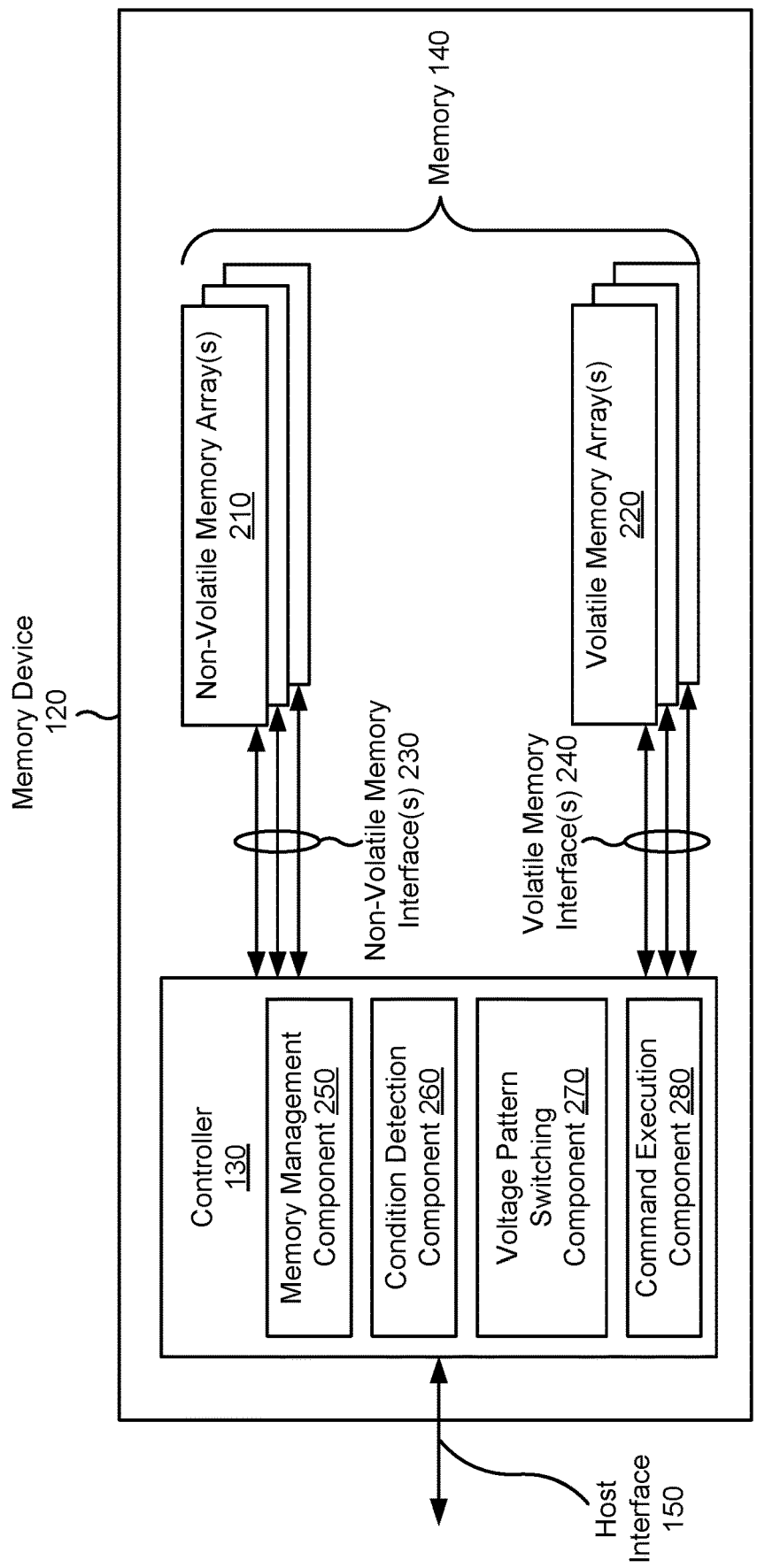
FIGS. 2-3 are diagrams of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, a condition detection component 260, a voltage pattern switching component 270, and/or a command execution component 280. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The condition detection component 260 may be configured to detect one or more conditions that trigger the memory device 120 to switch a voltage pattern used to write data to memory 140 (e.g., from a slow write voltage pattern to a fast write voltage pattern or from a fast write voltage pattern to a slow write voltage pattern), as described in more detail elsewhere herein. For example, the condition detection component 260 may detect a condition associated with power supplied to the memory device 120, may detect whether there are any pending write operations (e.g., queued for execution by the memory device 120), and/or may determine whether a P/E cycle satisfies a threshold. In some implementations, the condition detection component 260 includes a power management circuit to detect one or more parameters associated with power supplied to the memory device 120, such as voltage, current, or the like.

The voltage pattern switching component 270 may be configured to switch from a first write voltage pattern to a second write voltage pattern, as described in more detail elsewhere herein. For example, the voltage pattern switching component 270 may be configured to switch from the first write voltage pattern to the second write voltage pattern based on a condition detected by the condition detection component 260. In some implementations, the voltage pattern switching component 270 may be configured to switch from a slow write voltage pattern to a fast write voltage pattern (e.g., based on a first condition being satisfied). Additionally, or alternatively, the voltage pattern switching component 270 may be configured to switch from a fast write voltage pattern to a slow write voltage pattern (e.g., based on a second condition being satisfied and/or the first condition no longer being satisfied).

The command execution component 280 may be configured to execute one or more pending write operations using a write voltage pattern indicated by the voltage pattern switching component 270, as described in more detail elsewhere herein. For example, the command execution component 280 may be configured to apply a slow write voltage pattern or a fast write voltage pattern when performing one or more pending write operations.

Figure 6A:
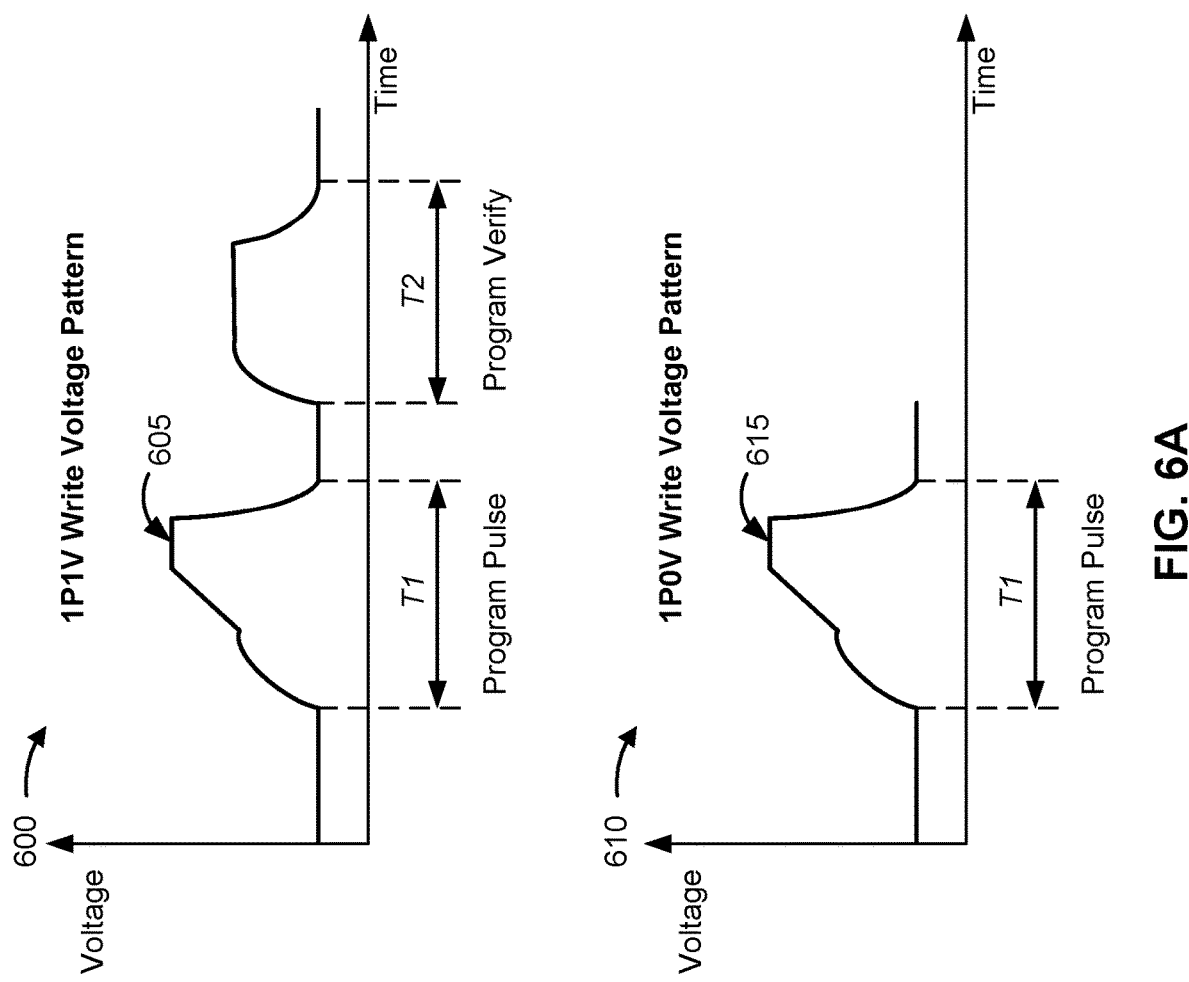
FIGS. 6A-6C are diagrams of example write voltage patterns that may be considered fast write voltage patterns for some implementations described herein.
Figure 6B:
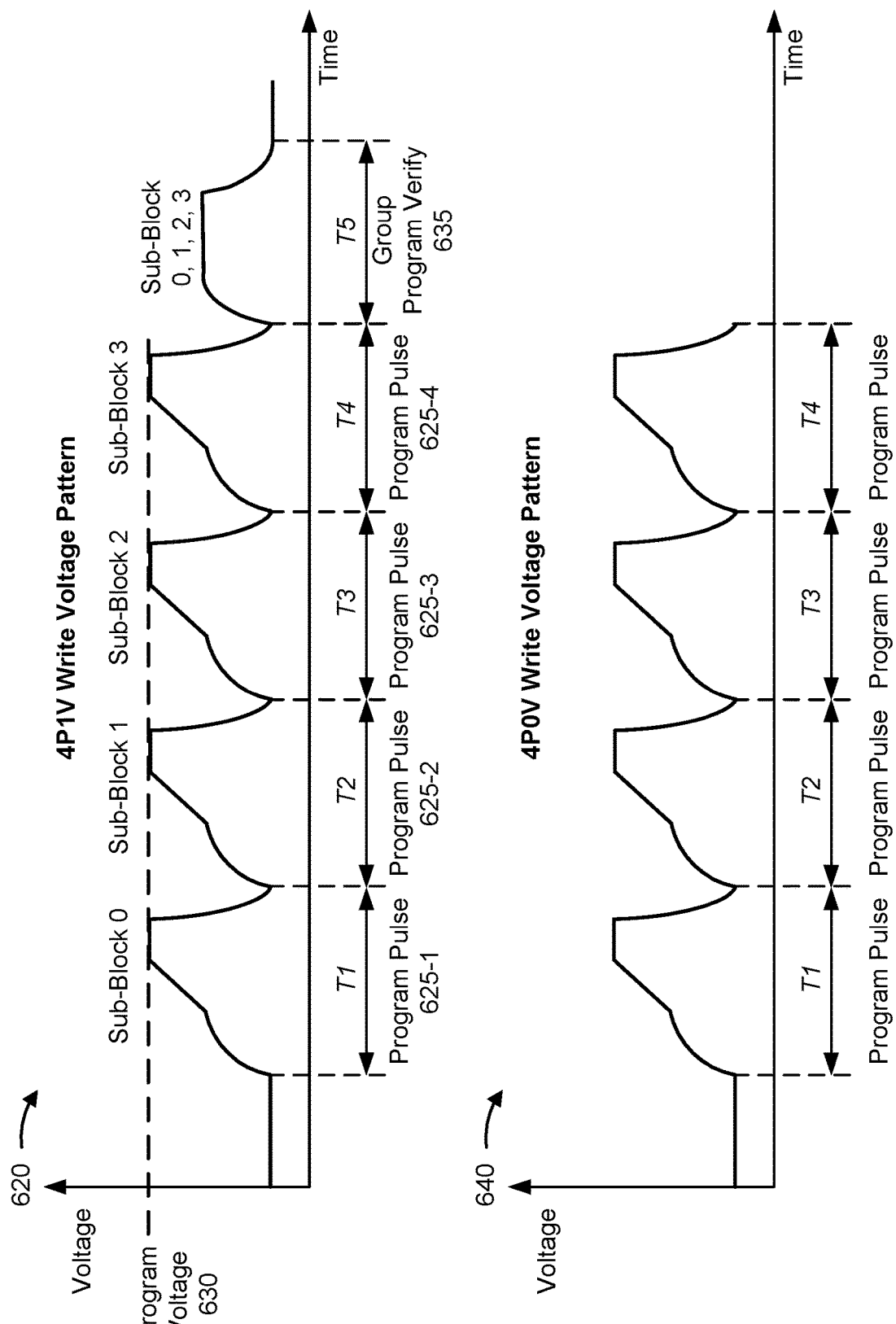
Figure 6C:
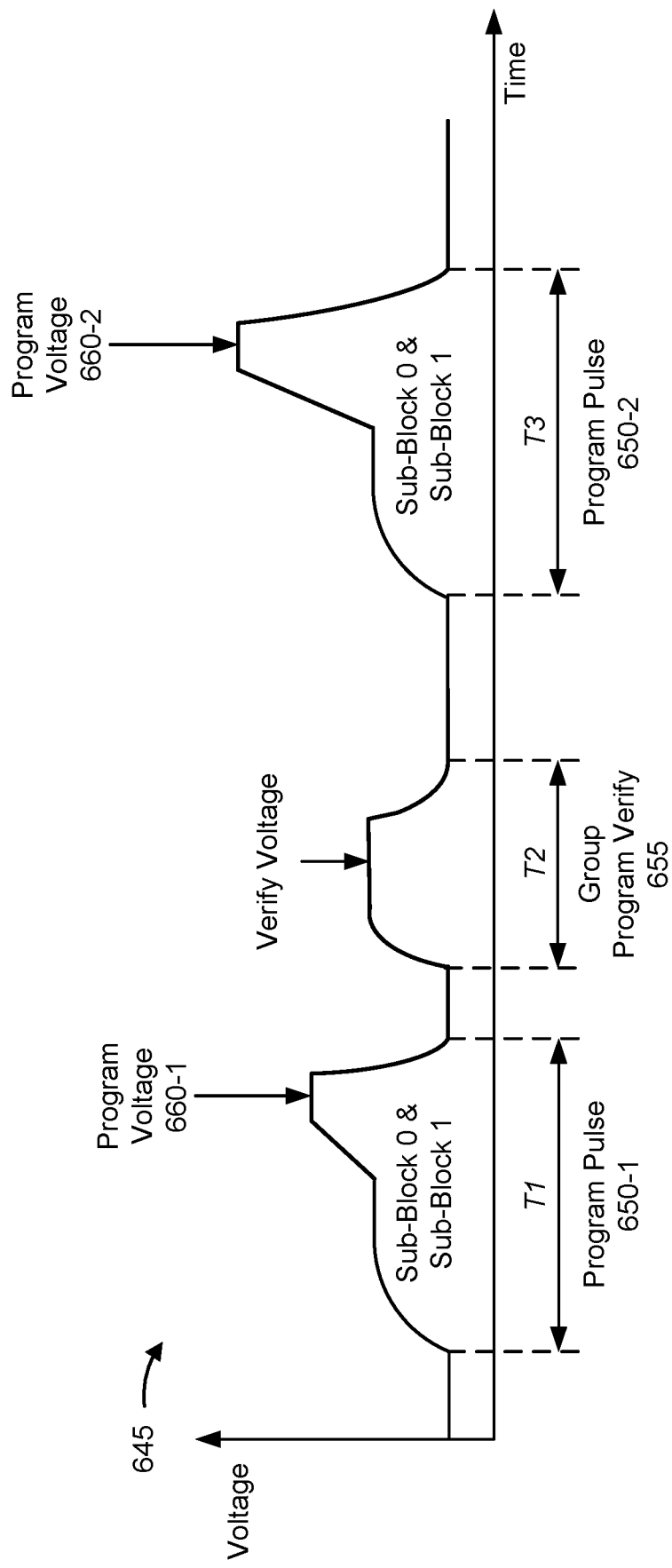
Figure 7:
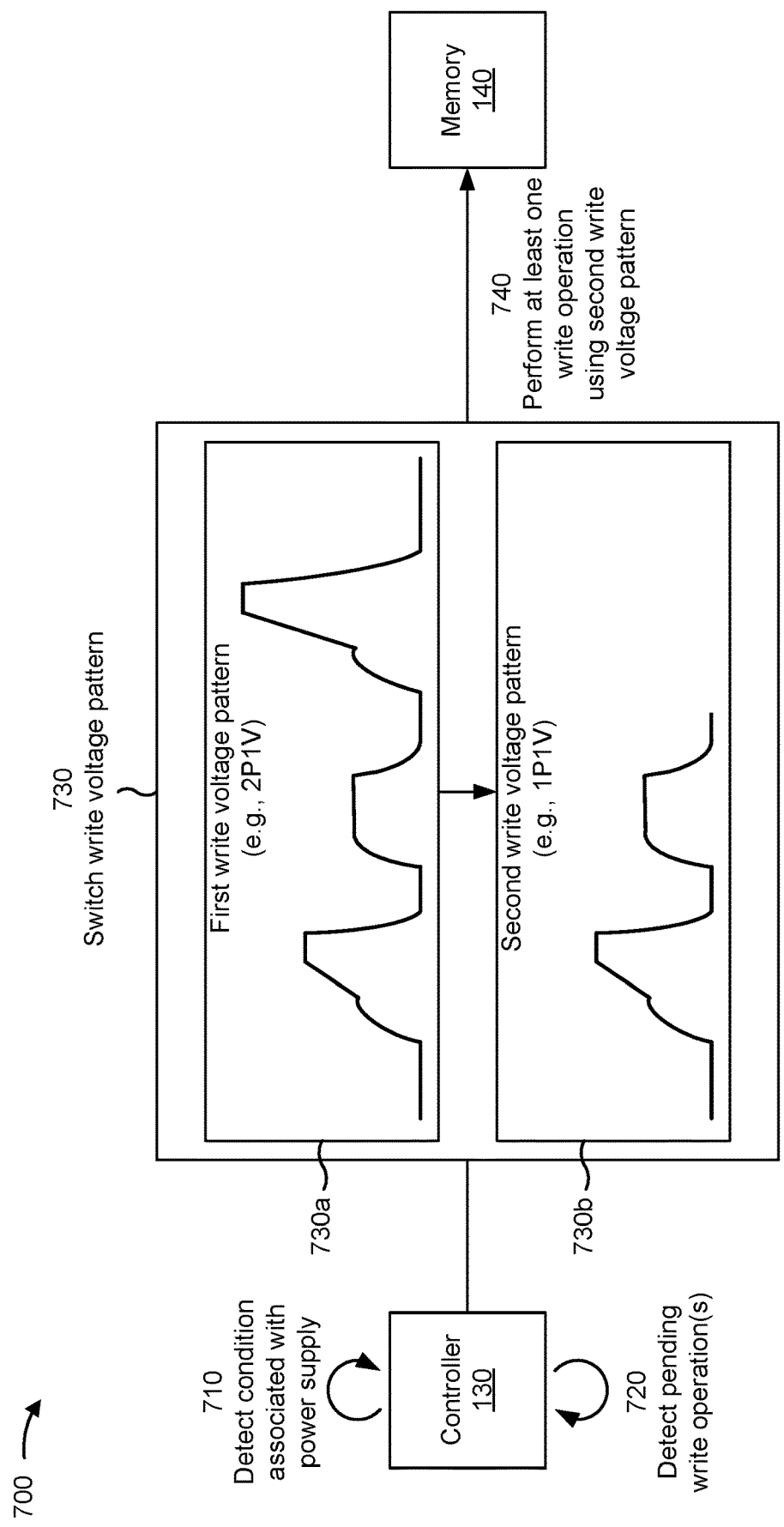
FIG. 7 is a diagram of an example of enabling a fast write mode to mitigate power loss.
Figure 8:
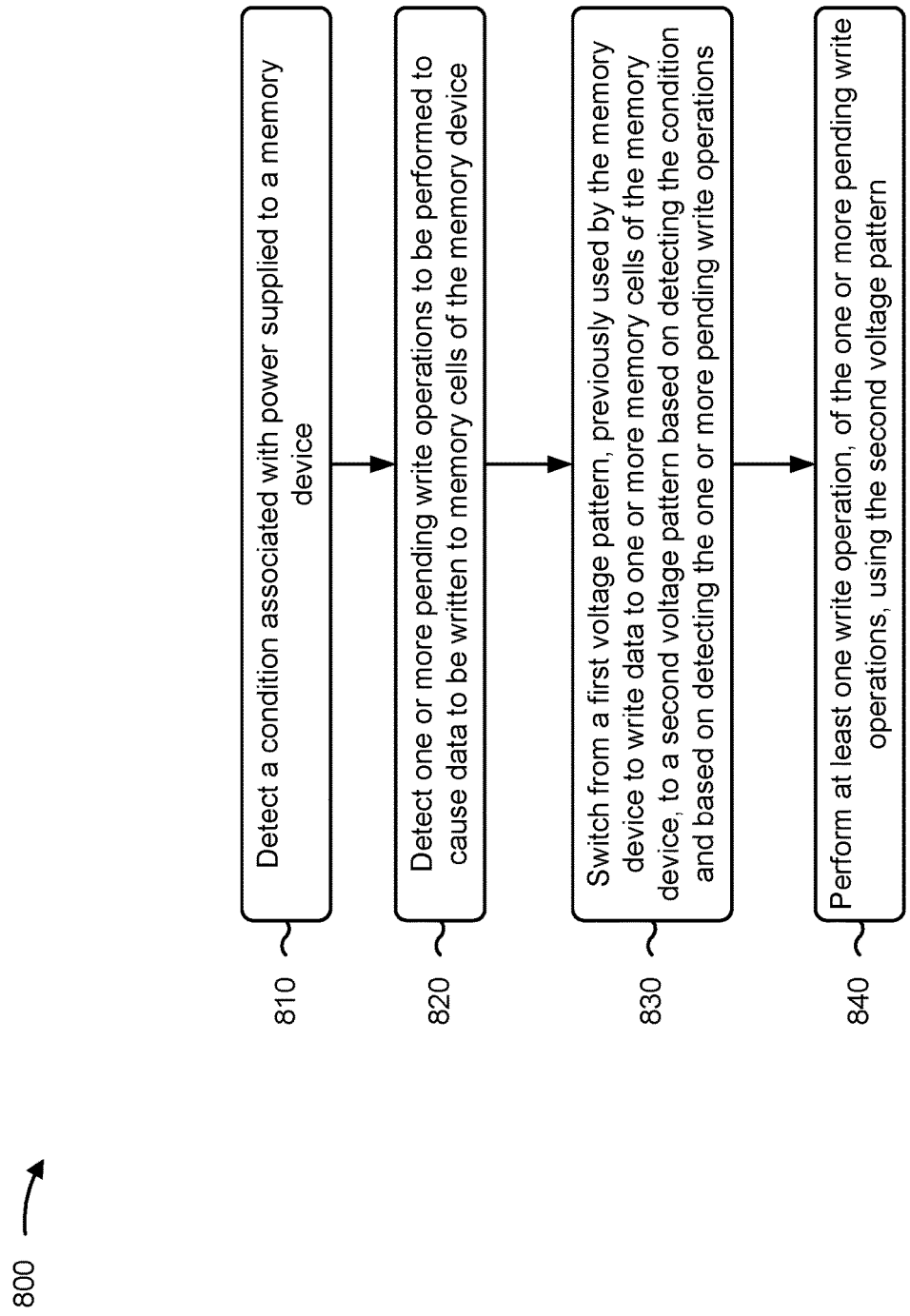
FIGS. 8-10 are flowcharts of example methods associated with enabling a fast write mode to mitigate power loss.
Figure 9:
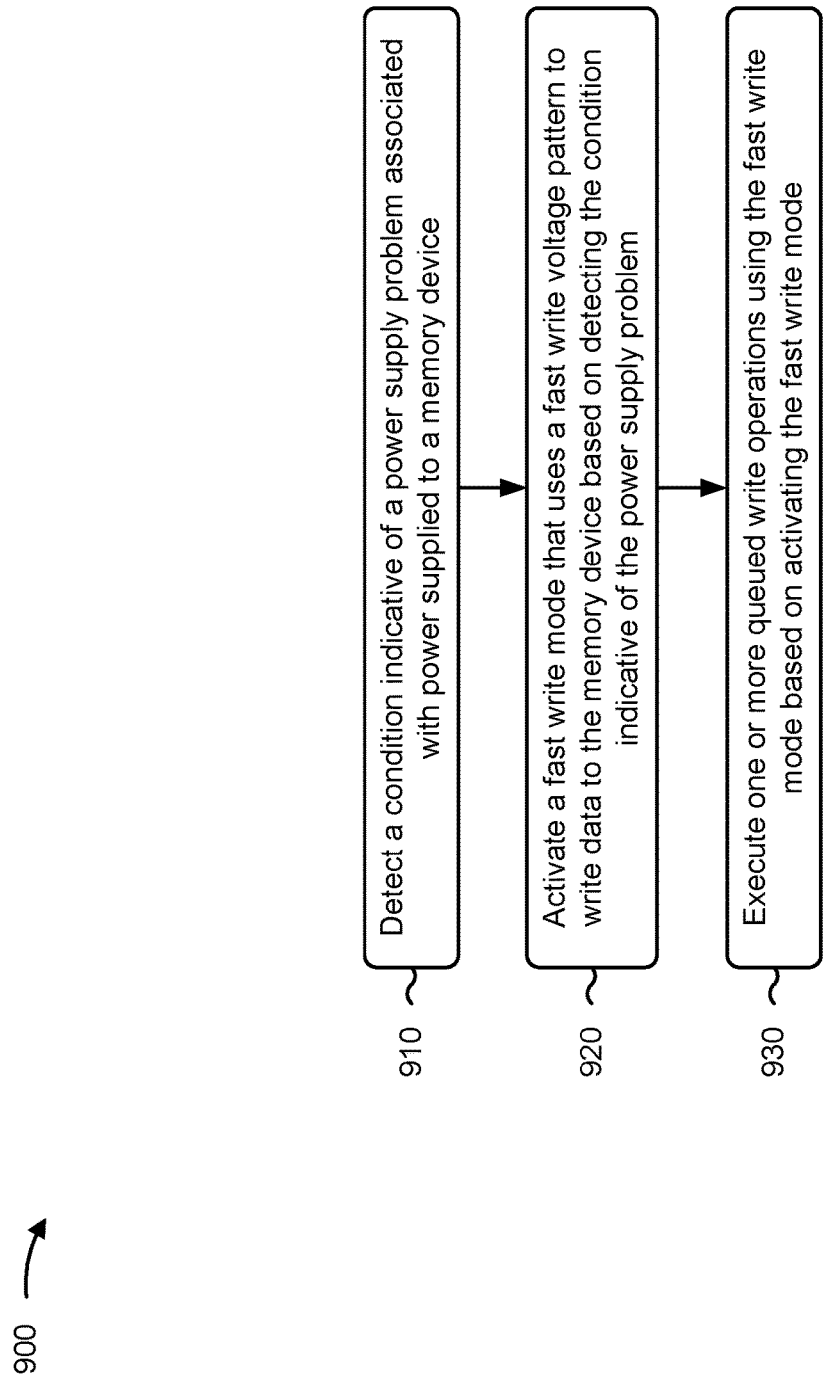

One or more devices or components shown in FIG. 2 may be configured to perform operations described elsewhere herein, such as one or more operations of FIG. 6 and/or one or more process blocks of the methods of FIGS. 7-9. For example, the controller 130, the memory management component 250, the condition detection component 260, the voltage pattern switching component 270, and/or the command execution component 280 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
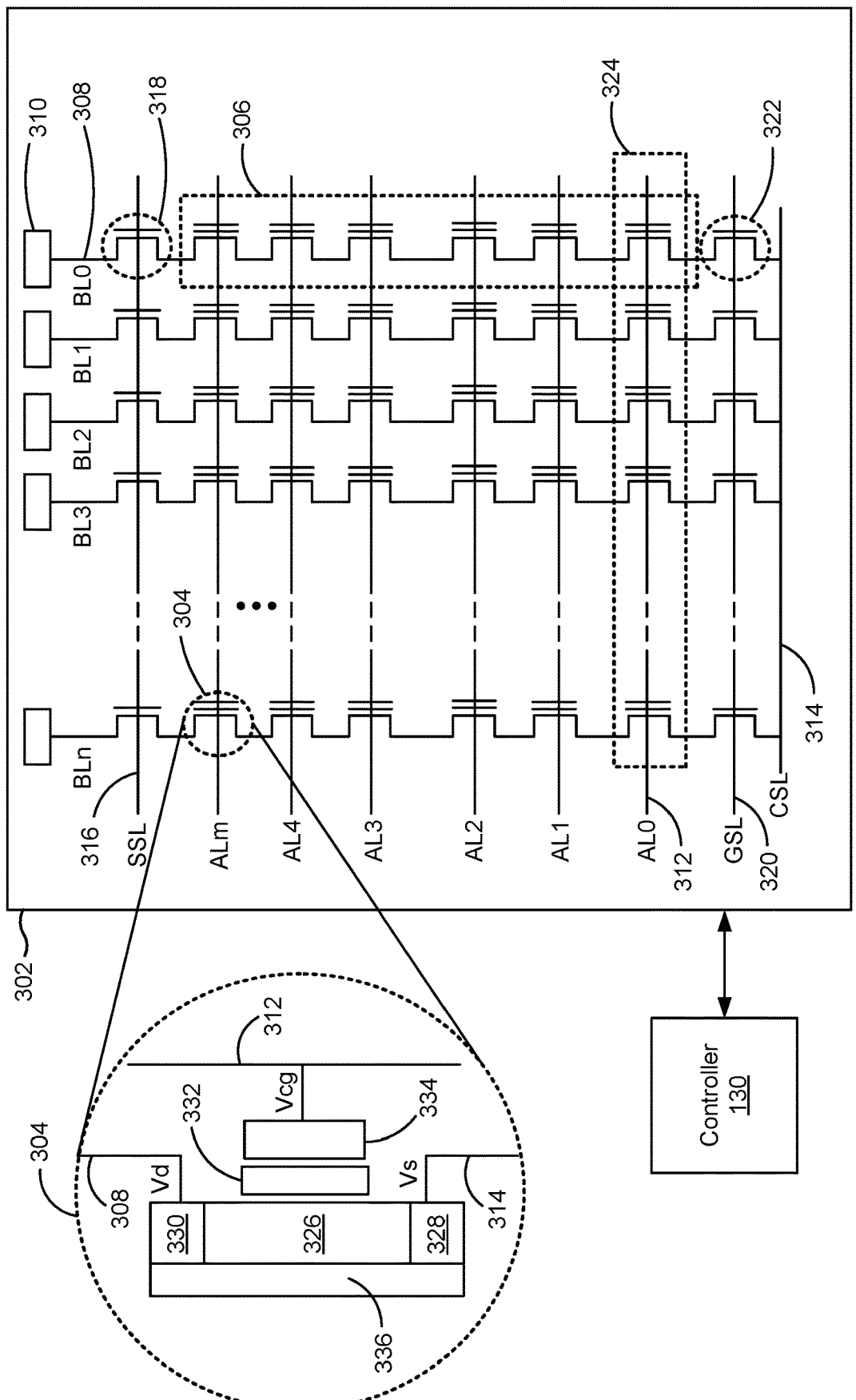

FIG. 3 is a diagram of example components included in a memory device 120. As described above in connection with FIG. 1, the memory device 120 may include a controller 130 and memory 140. As shown in FIG. 3, the memory 140 may include a memory array 302, which may correspond to a non-volatile memory array 210 described above in connection with FIG. 2.

In FIG. 3, the memory array 302 is a NAND memory array. However, in some implementations, the memory array 302 may be another type of memory array, such as a NOR memory array, a resistive RAM (RRAM) memory array, a magnetoresistive RAM (MRAM) memory array, a ferroelectric RAM (FeRAM) memory array, a spin-transfer torque RAM (STT-RAM) memory array, or the like. In some implementations, the memory array 302 is part of a three-dimensional stack of memory arrays, such as 3D NAND flash memory, 3D NOR flash memory, or the like.

The memory array 302 includes multiple memory cells 304. A memory cell 304 may store an analog value, such as an electrical voltage or an electrical charge, that represents a data state (e.g., a digital value). The analog value and corresponding data state depend on a quantity of electrons trapped or present within a region of the memory cell 304 (e.g., in a charge trap, such as a floating gate), as described below.

A NAND string 306 (sometimes called a string) may include multiple memory cells 304 connected in series. A NAND string 306 is coupled to a bit line 308 (sometimes called a digit line or a column line, and shown as BL0-BLn). Data can be read from or written to the memory cells 304 of a NAND string 306 via a corresponding bit line 308 using one or more input/output (I/O) components 310 (e.g., an I/O circuit, an I/O bus, a page buffer, and/or a sensing component, such as a sense amplifier). Memory cells 304 of different NAND strings 306 (e.g., one memory cell 304 per NAND string 306) may be coupled with one another via access lines 312 (sometimes called word lines or row lines, and shown as AL0-ALm) that select which row (or rows) of memory cells 304 is affected by a memory operation (e.g., a read operation or a write operation).

A NAND string 306 may be connected to a bit line 308 at one end and a common source line (CSL) 314 at the other end. A string select line (SSL) 316 may be used to control respective string select transistors 318. A string select transistor 318 selectively couples a NAND string 306 to a corresponding bit line 308. A ground select line (GSL) 320 may be used to control respective ground select transistors 322. A ground select transistor 322 selectively couples a NAND string 306 to the common source line 314.

A "page" of memory (or "a memory page") may refer to a group of memory cells 304 connected to the same access line 312, as shown by reference number 324. In some implementations (e.g., for single-level cells), the memory cells 304 connected to an access line 312 may be associated with a single page of memory. In some implementations (e.g., for multi-level cells), the memory cells 304 connected to an access line 312 may be associated with multiple pages of memory, where each page represents one bit stored in each of the memory cells 304 (e.g., a lower page that represents a first bit stored in each memory cell 304 and an upper page that represents a second bit stored in each memory cell 304). In NAND memory, a page is the smallest physically addressable data unit for a write operation (sometimes called a program operation).

In some implementations, a memory cell 304 is a floating-gate transistor memory cell. In this case, the memory cell 304 may include a channel 326, a source region 328, a drain region 330, a floating gate 332, and a control gate 334. The source region 328, the drain region 330, and the channel 326 may be on a substrate 336 (e.g., a semiconductor substrate). The memory device 120 may store a data state in the memory cell 304 by charging the floating gate 332 to a particular voltage associated with the data state and/or to a voltage that is within a range of voltages associated with the data state. This results in a predefined amount of current flowing through the channel 326 (e.g., from the source region 328 to the drain region 330) when a specified read voltage is applied to the control gate 334 (e.g., by a corresponding access line 312 connected to the control gate 334). Although not shown, a tunnel oxide layer (or tunnel dielectric layer) may be interposed between the floating gate 332 and the channel 326, and a gate oxide layer (e.g., a gate dielectric layer) may be interposed between the floating gate 332 and the control gate 334. As shown, a drain voltage Vd may be supplied from a bit line 308, a control gate voltage Vcg may be supplied from an access line 312, and a source voltage Vs may be supplied via the common source line 314 (which, in some implementations, is a ground voltage).

To write or program the memory cell 304, Fowler-Nordheim tunneling may be used. For example, a strong positive voltage potential may be created between the control gate 334 and the channel 326 (e.g., by applying a large positive voltage to the control gate 334 via a corresponding access line 312) while current is flowing through the channel 326 (e.g., from the common source line 314 to the bit line 308, or vice versa). The strong positive voltage at the control gate 334 causes electrons within the channel 326 to tunnel through the tunnel oxide layer and be trapped in the floating gate 332. These negatively charged electrons then act as an electron barrier between the control gate 334 and the channel 326 that increases the threshold voltage of the memory cell 304. The threshold voltage is a voltage required at the control gate 334 to cause current (e.g., a threshold amount of current) to flow through the channel 326. Fowler-Nordheim tunneling is an example technique for storing a charge in the floating gate, and other techniques, such as channel hot electron injection, may be used. In some implementations, incremental step pulse programing (ISPP) may be used to write or program the memory cell 304, as described below in connection with FIG. 4.

To read the memory cell 304, a read voltage may be applied to the control gate 334 (e.g., via a corresponding access line 312), and an I/O component 310 (e.g., a sense amplifier) may determine the data state of the memory cell 304 based on whether current passes through the memory cell 304 (e.g., the channel 326) due to the applied voltage. A pass voltage may be applied to all memory cells 304 (other than the memory cell 304 being read) in the same NAND string 306 as the memory cell 304 being read. For example, the pass voltage may be applied on each access line 312 other than the access line 312 of the memory cell 304 being read (e.g., where the read voltage is applied). The pass voltage is higher than the highest read voltage associated with any memory cell data states so that all of the other memory cells 304 in the NAND string 306 conduct, and the I/O component 310 can detect a data state of the memory cell 304 being read by sensing current (or lack thereof) on a corresponding bit line 308. For example, in a single-level memory cell that stores one of two data states, the data state is a "1" if current is detected, and the data state is a "0" if current is not detected. In a multi-level memory cell that stores one of three or more data states, multiple read voltages are applied, over time, to the control gate 334 to distinguish between the three or more data states and determine a data state of the memory cell 304.

To erase the memory cell 304, a strong negative voltage potential may be created between the control gate 334 and the channel 326 (e.g., by applying a large negative voltage to the control gate 334 via a corresponding access line 312). The strong negative voltage at the control gate 334 causes trapped electrons in the floating gate 332 to tunnel back across the oxide layer from the floating gate 332 to the channel 326 and to flow between the common source line 314 and the bit line 308. This removes the electron barrier between the control gate 334 and the channel 326 and decreases the threshold voltage of the memory cell 304 (e.g., to an empty or erased state, which may represent a "1").

As indicated above, FIG. 3 is provided as an example. Other examples may differ from what is described with regard to FIG. 3.

Figure 4:
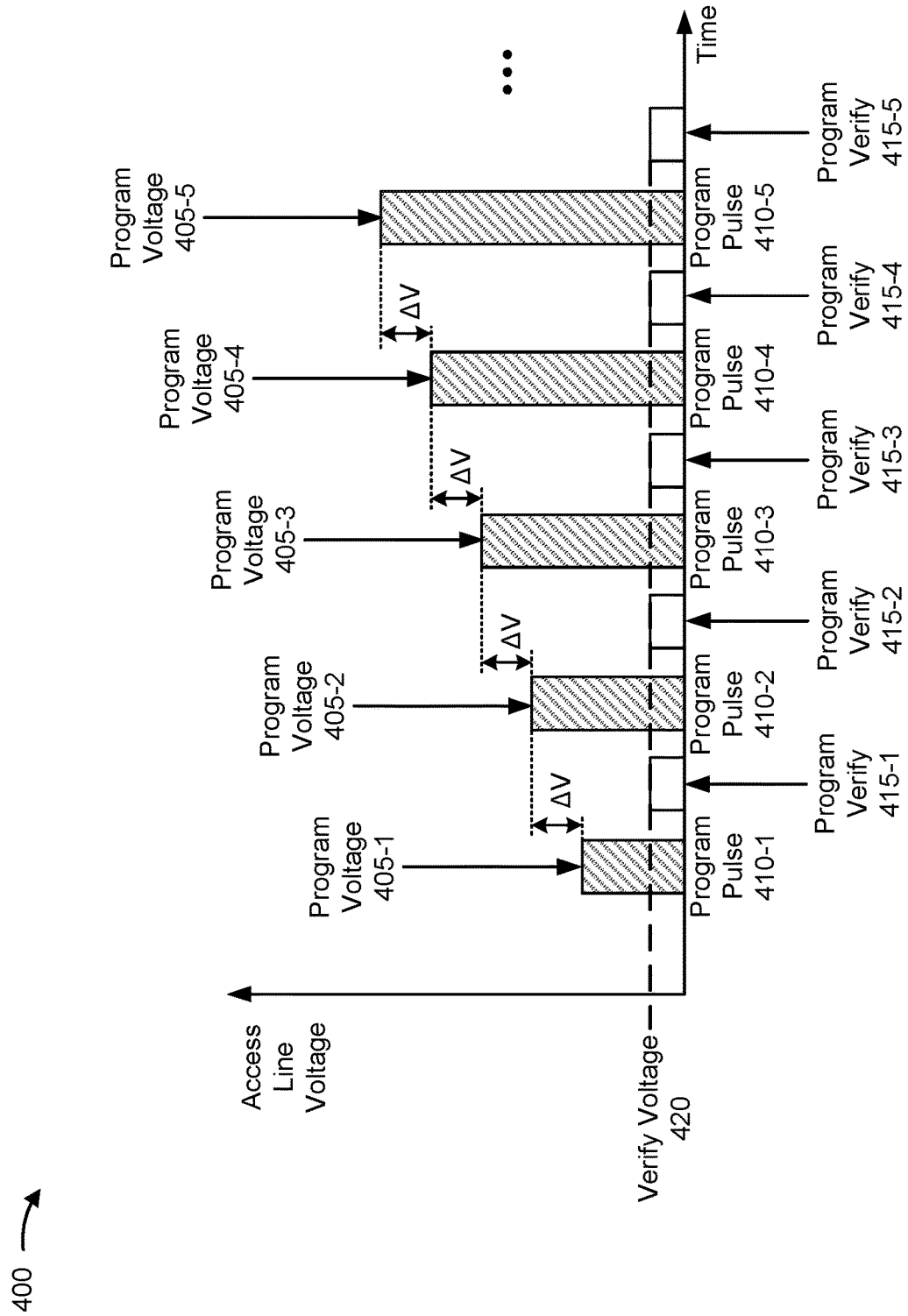
FIG. 4 is a diagram of an example of an incremental step pulse programming operation.

FIG. 4 is a diagram of an example 400 of an incremental step pulse programming (ISPP) operation. An ISPP operation may be used to program (i.e., write to) memory cells. In an ISPP operation, multiple program voltages 405 (sometimes called write voltages) are iteratively applied to a selected access line associated with a page to be programmed. The program voltages 405 increase in magnitude over time (shown as an increase of ΔV), such that an increasing voltage differential is applied to control gates of memory cells to be programmed. Each application of a program voltage 405 may be called a program pulse 410.

For example, a first program voltage 405-1 of a first program pulse 410-1 of an ISPP operation may be the lowest program voltage applied during the ISPP operation. A second program voltage 405-2 of a second program pulse 410-2 of the ISPP operation may be greater than the first program voltage 405-1 (e.g., by a pulse step voltage, shown as ΔV), a third program voltage 405-3 of a third program pulse 410-3 of the ISPP operation may be greater than the second program voltage 405-2 (e.g., by ΔV), and so on. Although the pulse step voltages are shown as being uniform between consecutive pulses, in some implementations, a non-uniform pulse step may be used.

In the ISPP operation, a program verify operation 415 (sometimes called a write verify operation) may be performed after each program pulse 410. The program verify operation 415 includes applying a verify voltage 420 to the selected access line to read the memory cells on the selected access line and determine whether those memory cells have been programmed (e.g., whether a program pulse 410 preceding the program verify operation 415 successfully programmed the memory cells). The program verify operation 415 may be used to differentiate between a set of "pass" memory cells that have been programmed to a desired state and a set of "fail" memory cells that have not been programmed to the desired state based on whether the memory cells conduct when the verify voltage 420 is applied. For example, the verify voltage 420 may be a read voltage corresponding to the desired state.

In some implementations, after a memory cell is identified as a pass memory cell that stores a desired state, that memory cell may be inhibited from further programming by subsequent program pulses 410 (e.g., program pulses 410, of the ISPP operation, that occur after the program verify operation 415 that verified the pass memory cell). For example, the memory device may apply an inhibit voltage (e.g., a positive voltage) to the bit line of the pass memory cell so that a program voltage 405 applied to the control gate of the pass memory cell does not create sufficient voltage differential to draw additional electrons into the floating gate. As an example, if a memory cell is identified as a pass memory cell based on performing the illustrated program verify operation 415-3, then that memory cell may be inhibited from programming during the program pulses 410-4 and 410-5. By inhibiting pass memory cells from further programming, the desired state can be locked into a pass memory cell and the endurance (e.g., a lifespan) of the pass memory cell may be extended by preventing incrementally greater program voltages 405 from degrading the pass memory cell.

The ISPP operation may continue until a condition is met, such as all of the selected memory cells being programmed in the desired state, a threshold quantity of program pulses 410 being applied, or a threshold program voltage 405 being reached. Although the ISPP operation shown in FIG. 4 includes five program pulses 410 and five program verify operations 415, the ISPP operation may include a different quantity of program pulses 410 and/or program verify operations 415 in some implementations.

As indicated above, FIG. 4 is provided as an example. Other examples may differ from what is described with regard to FIG. 4.

Figure 5:
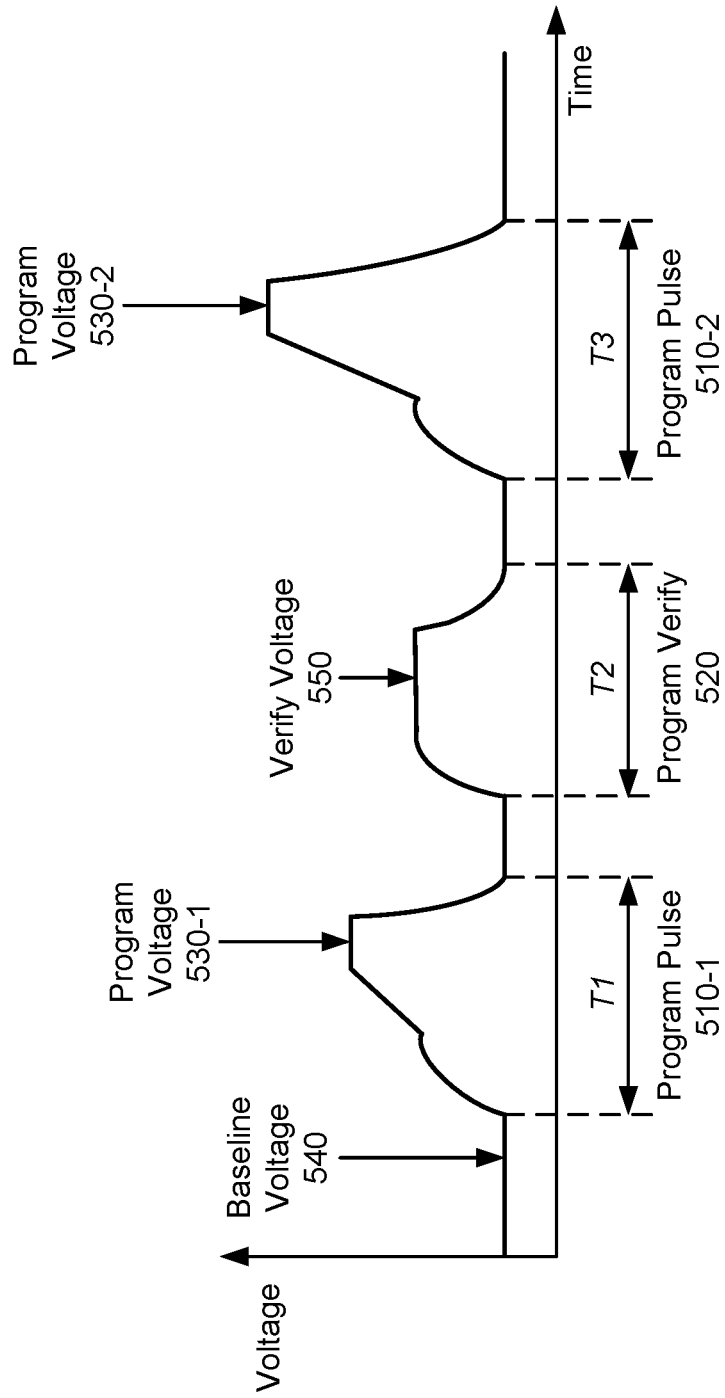
FIG. 5 is a diagram of an example write voltage pattern that may be considered a slow write voltage pattern for some implementations described herein.

FIG. 5 is a diagram of an example write voltage pattern that may be considered a slow write voltage pattern for some implementations described herein. The example write voltage pattern shown in FIG. 5 includes two program pulses 510 and one program verify operation 520, and thus may be called a two-pulse, one-verify (2P1V) write voltage pattern. As shown, the example 2P1V write voltage pattern includes a first program pulse 510-1 that is followed by a program verify operation 520 that is followed by a second program pulse 510-2. Each program pulse 510 is associated with a program voltage 530. As shown, a second program voltage 530-2 of the second program pulse 510-2 is greater (e.g., in magnitude) than a first program voltage 530-1 of the first program pulse 510-1, as explained above in connection with the ISPP operation. In some implementations, the 2P1V write voltage pattern may be applied to a single sub-block of memory to program the memory cells included in that sub-block.

As shown in FIG. 5, when a memory device 120 performs a 2P1V write operation using a 2P1V write voltage pattern, the memory device 120 raises the voltage on a selected access line from a baseline voltage 540 to the first program voltage 530-1 during a first time period T1 that corresponds to the first program pulse 510-1. The first program voltage 530-1 programs a first set of memory cells (sometimes called pass memory cells) on the selected access line to a desired state and fails to program a second set of memory cells (sometimes called fail memory cells) on the selected access line to the desired state. After applying the first program voltage 530-1, the memory device 120 may reduce the voltage on the selected access line to the baseline voltage 540.

The memory device 120 may then raise the voltage on the selected access line from the baseline voltage 540 to a verify voltage 550 during a second time period T2 that corresponds to the program verify operation 520. After raising the voltage to the verify voltage 550, the memory device 120 may perform a sensing operation (e.g., a read operation) to detect whether the verify voltage 550 applied to a memory cell causes that memory cell to conduct (e.g., whether current flows through the memory cell when the verify voltage 550 is applied). Based on a desired state of the memory cell and based on whether the memory cell conducts when the verify voltage 550 is applied, the memory device 120 may identify the memory cell as a pass memory cell that stores the desired state or a fail memory cell that does not store the desired state. For example, in a single-level memory cell that stores one of two data states, the memory device 120 may apply a verify voltage 550 that is between a first threshold voltage corresponding to a first data state (e.g., 1) and a second threshold voltage corresponding to a second data state (e.g., 0). In this example, the memory cell stores the first data state (e.g., 1) if current is detected, and the memory cell stores the second data state (e.g., 0) if current is not detected. After applying the verify voltage 550, the memory device 120 may reduce the voltage on the selected access line to the baseline voltage 540.

The memory device 120 may then raise the voltage on the selected access line from the baseline voltage 540 to the second program voltage 530-2 during a third time period T3 that corresponds to the second program pulse 510-2. The second program voltage 530-2 is greater in magnitude than the first program voltage 530-1, which causes some or all of the fail memory cells (e.g., that were not successfully programmed to the desired state based on application of the first program voltage 530-1) to be programmed to the desired state. After applying the second program voltage 530-2, the memory device 120 may reduce the voltage on the selected access line to the baseline voltage 540 to complete the 2P1V write operation.

In some implementations, memory cells that were successfully programmed by the first program voltage 530-1, as determined during the program verify operation 520, may be inhibited from being programmed with the second program voltage 530-2. This may increase endurance and prolong a lifespan of those memory cells, as compared to a scenario where the second program voltage 530-2 is applied to those memory cells, by preventing the second program voltage 530-2 from causing degradation of those memory cells. Thus, in some implementations, the 2P1V write operation may be considered a high endurance write operation (and the 2P1V write voltage pattern may be considered a high endurance write voltage pattern) compared to the write voltage patterns described below in connection with FIGS. 6A-6C. However, in some implementations, the 2P1V write operation may be considered a slow write operation (and the 2P1V write voltage pattern may be considered a slow write voltage pattern) as compared to the write voltage patterns described below in connection with FIGS. 6A-6C.

However, in some implementations, the 2P1V write operation may be considered a fast write voltage pattern as compared to another type of voltage pattern (not shown in FIGS. 6A-6C), such as a two pulse two verify (2P2V) write operation that includes two program pulses and two program verify operations. Furthermore, the 2P1V write voltage pattern is one example of a slow write voltage pattern, and other example slow write voltage patterns may be used in connection with the operations described herein. Similarly, in some implementations, the 2P1V write operation may be considered a low endurance write operation compared to another type of voltage pattern (not shown in FIGS. 6A-6C), such as a three pulse two verify (3P2V) write operation that includes three program pulses and two program verify operations. Furthermore, the 2P1V write voltage pattern is one example of a high endurance voltage pattern, and other example high endurance voltage patterns may be used in connection with the operations described herein.

As indicated above, FIG. 5 is provided as an example. Other examples may differ from what is described with regard to FIG. 5.

FIGS. 6A-6C are diagrams of example write voltage patterns that may be considered fast write voltage patterns for some implementations described herein. FIG. 6A shows an example one-pulse, one-verify (1P1V) write voltage pattern and an example one-pulse, zero-verify (1P0V) write voltage pattern, FIG. 6B shows an example four-pulse, one-verify (4P1V) write voltage pattern (sometimes called a four sub-block pulse, one group verify write voltage pattern) and an example four-pulse, zero-verify (4P0V) write voltage pattern, and FIG. 6C shows an example parallel programming write voltage pattern. The 1P1V write voltage pattern and the 1P0V write voltage pattern may be applied to a single sub-block of memory to program the memory cells included in that sub-block. The 4P1V write voltage pattern and the 4P0V write voltage pattern may be applied to a four sub-block of memory to program the memory cells included in those four sub-blocks. The parallel programming write voltage pattern may be applied to two sub-blocks of memory to program the memory cells included in those two sub-blocks.

As shown in FIG. 6A, and by reference number 600, when a memory device 120 performs a 1P1V write operation using a 1P1V write voltage pattern, the memory device 120 raises the voltage on a selected access line from a baseline voltage to a program voltage 605 during a first time period T1 that corresponds to a program pulse, in a similar manner as described above in connection with FIG. 5. The memory device 120 then performs a program verify operation by applying a verify voltage during a second time period T2, in a similar manner as described above in connection with FIG. 5. Unlike the 2P1V write operation, the memory device 120 does not apply a second program pulse after performing the program verify operation in the 1P1V write operation. In some implementation, the program verify operation is performed to determine whether a threshold quantity of memory cells have been successfully programmed. The write operation may pass or fail based on whether the threshold quantity of memory cells have been successfully programmed.

In some implementations, the program voltage 605 of the 1P1V write operation is greater than the first program voltage 530-1 of the 2P1V write operation described above in connection with FIG. 5. For example, the program voltage 605 of the 1P1V write operation may be greater than or equal to the second program voltage 530-2 of the 2P1V write operation described above in connection with FIG. 5. As a result, a greater quantity of memory cells are programmed by the single program pulse of the 1P1V write operation as compared to the first program pulse 510-1 of the 2P1V write operation. Because the 1P1V write operation includes fewer program pulses than the 2P1V write operation, the 1P1V write operation has a faster write time than the 2P1V write operation. However, because the program voltage 605 is higher and there are not any memory cells that are protected from this higher voltage by inhibiting those memory cells in the 1P1V write operation, the 1P1V write operation may lead to faster degradation of memory cells (e.g., poorer endurance and/or a shorter lifespan) than the 2P1V write operation.

As further shown in FIG. 6A, and by reference number 610, when a memory device 120 performs a 1P0V write operation using a 1P0V write voltage pattern, the memory device 120 raises the voltage on a selected access line from a baseline voltage to a program voltage 615 during a first time period T1 that corresponds to a program pulse, in a similar manner as described above in connection with FIG. 5. Unlike the 2P1V write operation and the 1P1V write operation, the memory device 120 does not perform a program verify operation after applying the single program pulse in the 1P0V write operation.

In some implementations, the program voltage 615 of the 1P0V write operation is greater than the first program voltage 530-1 of the 2P1V write operation described above in connection with FIG. 5. For example, the program voltage 615 of the 1P0V write operation may be greater than or equal to the second program voltage 530-2 of the 2P1V write operation described above in connection with FIG. 5. Additionally, or alternatively, the program voltage 615 of the 1P0V write operation may be greater than or equal to the program voltage 605 of the 1P1V write operation (because the memory device 120 does not verify that memory cells have been successfully programmed in the 1P0V write operation, and therefore may apply a greater voltage to increase the likelihood of successful programming).

As a result, a greater quantity of memory cells are programmed by the single program pulse of the 1P0V write operation as compared to the first program pulse 510-1 of the 2P1V write operation (and, in some implementations, as compared to the single program pulse 605 of the 1P1V write operation). Because the 1P0V write operation includes fewer program pulses and fewer program verify operations than the 2P1V write operation, the 1P0V write operation has a faster write time than the 2P1V write operation. Furthermore, because the 1P0V write operation includes fewer program verify operations than the 1P1V write operation, the 1P0V write operation has a faster write time than the 1P1V write operation. However, because the program voltage 615 is higher and there are not any memory cells that are protected from this higher voltage by inhibiting those memory cells in the 1P0V write operation, the 1P0V write operation may lead to faster degradation of memory cells (e.g., poorer endurance and/or a shorter lifespan) as compared to the 2P1V write operation (and, in some implementations, as compared to the 1P1V write operation).

As shown in FIG. 6B, and by reference number 620, when a memory device 120 performs a 4P1V write operation (sometimes called a four sub-block pulse, one group verify write operation) using a 4P1V write voltage pattern, the memory device 120 may apply a program pulse to each of four different sub-blocks of memory, and may then perform a group verify operation for all of the sub-blocks. For example, the memory device 120 may apply four program pulses 625, each associated with a different sub-block of the memory device 120, followed by a program verify operation (e.g., a group program verify operation). A "sub-block" is a portion of a memory block. For example, a sub-block may include a subset of NAND strings and/or memory cells included in a block, and each sub-block may be mutually exclusive from one another. A bit line may be shared by multiple sub-blocks. For example, a first sub-block (e.g., Sub-Block 0) may include a first group of NAND strings, a second sub-block (e.g., Sub-Block 1) may include a second group of NAND strings, a third sub-block (e.g., Sub-Block 2) may include a third group of NAND string, and a fourth sub-block (e.g., Sub-Block 3) may include a fourth group of NAND strings. Each NAND string may include a respective memory cell that is on the selected access line to be programmed.

As shown, the memory device 120 may apply a first program pulse 625-1 to the first sub-block by applying a program voltage 630 on the selected access line for the first sub-block (e.g., while the first sub-block is selected and the other sub-blocks are not selected) during a first time period T1, in a similar manner as described elsewhere herein. After applying the first program pulse 625-1, the memory device 120 may apply a second program pulse 625-2 to the second sub-block by applying the program voltage 630 on the selected access line for the second sub-block (e.g., while the second sub-block is selected and the other sub-blocks are not selected) during a second time period T2, in a similar manner as described elsewhere herein. After applying the second program pulse 625-2, the memory device 120 may apply a third program pulse 625-3 to the third sub-block by applying the program voltage 630 on the selected access line for the third sub-block (e.g., while the third sub-block is selected and the other sub-blocks are not selected) during a third time period T3, in a similar manner as described elsewhere herein. After applying the third program pulse 625-3, the memory device 120 may apply a fourth program pulse 625-4 to the fourth sub-block by applying the program voltage 630 on the selected access line for the fourth sub-block (e.g., while the fourth sub-block is selected and the other sub-blocks are not selected) during a fourth time period T4, in a similar manner as described elsewhere herein.

After applying a separate program pulse 625 to each of the four sub-blocks, the memory device 120 may perform a group program verify operation 635 on all of the sub-blocks (e.g., simultaneously, concurrently, or in parallel). The group program verify operation 635 may include applying a verify voltage during a fifth time period T5, in a similar manner as described above in connection with FIG. 5. The memory device 120 may apply the verify voltage to all of the sub-blocks (e.g., Sub-Blocks 0, 1, 2, and 3), such as by selecting all of the sub-blocks while applying the verify voltage to the access line. After raising the voltage to the verify voltage, the memory device 120 may perform a sensing operation (e.g., a read operation) to detect memory cells that are programmed to the desired state and to detect memory cells that are not programmed to the desired state.

Whenever a program pulse is applied (e.g., using any of the write voltage patterns described herein), the memory device 120 performs a preparation operation prior to applying the program pulse. The preparation operation may include, for example, transferring data, to be written to non-volatile memory, from volatile memory (e.g., DRAM) to a latch. In the 4P1V write operation, the preparation operation prior to a program pulse can be performed in parallel with applying the preceding program pulse. For example, the preparation operation for the second program pulse 625-2 can be performed during time period T1 of the first program pulse 625-1, the preparation operation for the third program pulse 625-3 can be performed during time period T2 of the second program pulse 625-2, and so on. As a result, the 4P1V operation has a faster write time on a per-sub-block basis than the 2P1V write operation, the 1P1V write operation, and the 1P0V write operation. However, because the program voltage 630 of the 4P1V operation is higher than the first program voltage 530-1 of the 2P1V write operation (e.g., for reasons described in connection with the 1P1V operation) and there are not any memory cells that are protected from this higher voltage by inhibiting those memory cells in the 4P1V write operation, the 4P1V write operation may lead to faster degradation of memory cells (e.g., poorer endurance and/or a shorter lifespan) than the 2P1V write operation.

As further shown in FIG. 6B, and by reference number 640, when a memory device 120 performs a 4P0V write operation using a 4P0V write voltage pattern, the memory device 120 may apply a program pulse to each of four different sub-blocks of memory in the same manner as described in connection with the 4P1V write operation. However, unlike the 4P1V write operation, the memory device 120 does not perform a group program verify operation (or any program verify operation) in the 4P0V write operation after applying the four program pulses. For example, the memory device 120 may apply four program pulses, each associated with a different sub-block of the memory device, that are not followed by a program verify operation (e.g., are not followed by any program verify operation).

As a result, the 4P0V write operation has a faster write time on a per-sub-block basis than the 4P1V write operation, the 2P1V write operation, the 1P1V write operation, and the 1P0V write operation. However, because the program voltage of the 4P0V operation is higher than the first program voltage 530-1 of the 2P1V write operation (e.g., for reasons described in connection with the 1P1V operation) and there are not any memory cells that are protected from this higher voltage by inhibiting those memory cells in the 4P0V write operation, the 4P0V write operation may lead to faster degradation of memory cells (e.g., poorer endurance and/or a shorter lifespan) than the 2P1V write operation.

As shown in FIG. 6C, and by reference number 645, when a memory device 120 performs a parallel programming write operation using a parallel programming write voltage pattern, the memory device 120 is capable of programming two or more sub-blocks with a single program pulse. In the example parallel programming write operation shown in FIG. 6C, the memory device 120 applies a first program pulse 650-1 configured to write to two sub-blocks of the memory device 120, followed by a group program verify operation 655 on the two sub-blocks, followed by a second program pulse 650-2 configured to write to the two sub-blocks of the memory device.

For example, the memory device 120 may apply the first program pulse 650-1 to the first sub-block and the second sub-block by applying a first program voltage 660-1 on the selected access line for the first sub-block and the second sub-block during a first time period T1. After applying the first program pulse 650-1, the memory device 120 may perform a group program verify operation 655 on the first sub-block and the second sub-block (e.g., simultaneously, concurrently, or in parallel). The group program verify operation 655 may include applying a verify voltage during a second time period T2, in a similar manner as described above in connection with the 4P1V write operation. The memory device 120 may identify pass memory cells and fail memory cells in the first sub-block and the second sub-block, and may apply the second program pulse 650-2 to the first sub-block and the second sub-block by applying a second program voltage 660-2 on the selected access line for fail memory cells of the first sub-block and the second sub-block during a third time period T3.

Because the parallel programming write operation is capable of writing to multiple sub-blocks using the same program pulse, the parallel programming operation may have a faster write time on a per-sub-block basis than the 2P1V write operation and the 1P1V write operation. However, because the parallel programming write operation includes a program verify operation, the parallel programming operation may have a slower write time on a per-sub-block basis than the 1P0V write operation.

In some cases, the order of the write voltage patterns described herein from slowest write time to fastest write time is the 2P1V write voltage pattern, the 1P1V write voltage pattern, the parallel programming write voltage pattern, the 1P0V write voltage pattern, the 4P1V write voltage pattern, and the 4P0V write voltage pattern. In some implementations, the 2P1V write voltage pattern is considered a slow write voltage pattern used for default operations (e.g., when a condition indicative of a power supply problem is not detected), and any one of the other write voltage patterns can be considered a fast write voltage pattern to be used when a condition indicative of a power supply problem is detected. Alternatively, any one of the slower write voltage patterns (e.g., according to the above order) can be used as a slow write voltage pattern for default operations, and any one of the other write voltage patterns that is faster than that slow write voltage pattern can be used as a fast write voltage pattern when a condition indicative of a power supply problem is detected.

In some cases, a fast write voltage pattern consumes less power (e.g., per sub-block write) than a slow write voltage pattern because fewer voltages (e.g., program voltages and/or verify voltages) are applied (e.g., per sub-block) for the fast write voltage pattern as compared to the slow write voltage pattern. Additionally, or alternatively, a write voltage pattern that includes a particular quantity of program pulses without a program verify operation (or that includes a smaller quantity of program verify operations) may consume less power than a write voltage pattern that has the same particular quantity of program pulses and includes a program verify operation (or includes a greater quantity of program verify operations). In some implementations, the 2P1V write voltage pattern is considered a high power consumption write voltage pattern used for default operations (e.g., when a condition indicative of a power supply problem is not detected), and any one of the other write voltage patterns can be considered a low power consumption write voltage pattern to be used when a condition indicative of a power supply problem is detected. Alternatively, any one of the higher power consumption write voltage patterns (e.g., according to the above order) can be used as a high power consumption write voltage pattern for default operations, and any one of the other write voltage patterns that consumes less power than that high power consumption write voltage pattern can be used as a low power consumption write voltage pattern when a condition indicative of a power supply problem is detected.

In some cases, the order of the write voltage patterns described herein from highest endurance (e.g., least destructive to memory cells) to lowest endurance (e.g., most destructive to memory cells is the 2P1V write voltage, the 1P0V write voltage pattern and the 1P1V write voltage pattern (having the same endurance), the 4P0V write voltage pattern and the 4P1V write voltage pattern (having the same endurance). If the parallel programming write operation includes two program pulses, then the parallel programming write operation may have the same endurance as the 2P1V write operation. If the parallel programming write operation includes one program pulse, then the parallel programming write operation may have the same endurance as the 1P1V write operation and the 1P0V write operation. In some implementations, the 2P1V write voltage pattern is considered a high endurance write voltage pattern used for default operations (e.g., when a condition indicative of a power supply problem is not detected), and any one of the other write voltage patterns can be considered a low endurance write voltage pattern that is used when a condition indicative of a power supply problem is detected. Alternatively, any one of the higher endurance write voltage patterns (e.g., according to the above order) can be used as a high endurance write voltage pattern for default operations, and any one of the other write voltage patterns associated with a lower endurance than that high endurance write voltage pattern can be used as a low endurance write voltage pattern when a condition indicative of a power supply problem is detected.

The write voltage patterns shown in FIG. 5, FIG. 6A, FIGS. 6B, and 6C and described above are provided as examples, and other write voltage patterns may be used in connection with the operations described herein. In general, a first write voltage pattern, that has a slower write time than a second write voltage pattern, can be used as a slow write voltage pattern for default operations, and the second write voltage pattern, that has a faster write time than the first write voltage pattern, can be used as a fast write voltage pattern when a condition indicative of a power supply problem is detected. Similarly, a first write voltage pattern, that has higher power consumption than a second write voltage pattern, can be used as a high power consumption write voltage pattern for default operations, and the second write voltage pattern, that has lower power consumption than the first write voltage pattern, can be used as a low power consumption write voltage pattern when a condition indicative of a power supply problem is detected. Similarly, a first write voltage pattern, that has higher endurance than a second write voltage pattern, can be used as a high endurance write voltage pattern for default operations, and the second write voltage pattern, that has lower endurance than the first write voltage pattern, can be used as a low endurance write voltage pattern when a condition indicative of a power supply problem is detected.

As indicated above, FIGS. 6A-6C are provided as examples. Other examples may differ from what is described with regard to FIGS. 6A-6C.

FIG. 7 is a diagram of an example 700 of enabling a fast write mode to mitigate power loss. The operations described in connection with FIG. 7 may be performed by the memory device 120 and/or one or more components of the memory device 120, such as the controller 130.

As shown by reference number 710, the controller 130 may detect a condition associated with power supplied to the memory device 120. The condition may be indicative of a problem (e.g., a power supply problem) associated with the power supplied to the memory device 120. For example, the condition may by indicative of an unstable power supply and/or an upcoming power loss, whether planned (e.g., based on an instruction from a host device to power off) or unplanned (e.g., due to a power outage or a malfunction). Thus, in some implementations, the controller 130 may detect a condition indicative of an upcoming power loss for the memory device 120. The power loss may be a full power loss (e.g., where the memory device 120 does not receive any power) or a partial power loss (e.g., where the memory device 120 receives some power, but that power is not sufficient for operations of the memory device 120). Furthermore, the power loss may be for a long period of time (e.g., a power outage that lasts minutes or hours) or may be for a short period of time (e.g., a voltage fluctuation or power shortage that lasts seconds or milliseconds).

In some implementations, the controller 130 may receive, from the host device 110, an indication of the upcoming power loss. For example, the host device 110 may transmit a message (e.g., a host command) to the memory device 120 that includes an instruction for the memory device 120 to power down. The host device 110 may transmit the message based on receiving user input (e.g., user input instructing the host device 110 to power down) or may transmit the message without user input (e.g., based on detecting low battery power or another condition associated with power supplied to the host device 110). Thus, in some implementations, the host device 110 may detect a condition associated with power supplied to the host device 110, and may instruct the memory device 120 to power down based on detecting that condition. In this case, the condition associated with power supplied to the memory device 120 may include receipt of a message from the host device 110 that instructs the memory device 120 to power down.

In some implementations, the controller 130 may detect the condition associated with power supplied to the memory device 120 without receiving a message from the host device 110. For example, the controller 130 may detect that a power parameter satisfies a condition indicative of an upcoming power loss. The parameter may include a power parameter, such as voltage or current. For example, the controller 130 may detect a voltage drop that satisfies a threshold (e.g., the voltage decreases by a threshold amount and/or the voltage decreases below a threshold level), may detect a voltage spike that satisfies a threshold (e.g., the voltage increases by a threshold amount and/or the voltage increases above a threshold level), and/or may detect a threshold change in voltage within a threshold time period (e.g., a voltage fluctuation within a time window). Additionally, or alternatively, the controller 130 may detect a current drop that satisfies a threshold (e.g., the current decreases by a threshold amount and/or the current decreases below a threshold level), may detect a current spike that satisfies a threshold (e.g., the current increases by a threshold amount and/or the current increases above a threshold level), and/or may detect a threshold change in current within a threshold time period (e.g., a current fluctuation within a time window).

As shown by reference number 720, the controller 130 may detect one or more pending write operations. For example, after detecting the condition associated with the power supply, the controller 130 may determine whether there are any pending write operations (sometimes called program operations) to be performed by the memory device 120 (e.g., to cause data to be written to memory cells of the memory device 120). In some implementations, the memory device 120 may store write operations (e.g., write commands) in a queue (e.g., in memory 140) prior to execution by the memory device 120. In this case, the controller 130 may determine whether the queue (e.g., a command queue) includes any write operations (e.g., write commands).

In some implementations, the memory device 120 may receive data to be written to memory 140, and may store that data in single-level cell (SLC) memory cells for some period of time before transferring the data to memory cells capable of storing more than one bit per cell, such as multi-level cells (MLCs), triple-level cells (TLCs), quad-level cells (QLCs), or penta-level cells (PLCs). In this case, a pending write operation to transfer data from SLCs to memory cells capable of storing more than one bit per cell may not be important to execute prior to power loss because that data is already stored in non-volatile memory (e.g., SLCs) and will be retained after power loss. On the other hand, a pending write operation to write data to SLCs (e.g., from volatile memory) may be important to execute prior to power loss because that data is not stored in non-volatile memory and will be lost if power is lost. Thus, in some implementations, the memory device 120 may detect whether there are any pending write operations to write data to SLCs (e.g., one or more SLC arrays). In this case, the memory device 120 may ignore any pending write operations to transfer data from SLCs to memory cells capable of storing more than one bit per cell.

In some implementations, the controller 130 may determine whether the queue includes any host write operations. A host write operation may correspond to a host write command received from a host device 110. A host write command may include a command to write new data to the memory 140 (e.g., rather than transferring data from SLCs to memory cells capable of storing more than one bit per cell, as described above). In this case, the memory device 120 may ignore pending non-host write operations that correspond to non-host write commands. A non-host write command may include a write command that is not received from the host device 110 and/or that is generated internally by the memory device 120 (e.g., to transfer data from SLCs to MLCs, TLCs, QLCs, PLCs, or the like). The controller 130 may identify host write commands and ignore non-host write commands to prioritize the writing of new data, which would be lost if power is lost (e.g., as compared to data already stored in memory 140 and queued up for transfer between memory arrays with different types of memory cells).

As shown by reference number 730, the controller 130 may switch from a first write voltage pattern 730a to a second write voltage pattern 730b based on detecting the condition associated with power supplied to the memory device 120 and based on detecting the one or more pending write operations (e.g., any pending write operations or only SLC write operations). In some implementations, the memory device 120 uses the first write voltage pattern 730a for default write operations, such as write operations that were previously performed prior to the memory device 120 detecting the condition, write operations that are performed when the condition associated with power supplied to the memory device 120 has not been detected, and/or write operations that are performed when the condition is not satisfied. When the condition is detected, the memory device 120 may switch from using the first write voltage pattern 730a to the second write voltage pattern 730b. As described above in connection with FIG. 5 and FIGS. 6A-6C, a write voltage pattern may be used to write data to one or more memory cells of the memory device 120. In some implementations, the write voltage pattern may be used to write data to SLC memory cells.

In some implementations, switching from the first write voltage pattern 730a to the second write voltage pattern 730b may include switching from a first write mode to a second write mode. For example, the memory device 120 may activate the second write mode based on detecting the condition and/or based on detecting the one or more pending write operations. The first write mode may be a slow write mode, a high power consumption mode, and/or a high endurance mode, and the second write mode may be a fast write mode, a low power consumption mode, and/or a low endurance mode. When operating in the first write mode, the memory device 120 may use the first write voltage pattern 730a to perform write operations (e.g., execute write commands). When operating in the second write mode, the memory device 120 may use the second write voltage pattern 730b to perform write operations (e.g., execute write commands).

In some implementations, the second write voltage pattern 730b may be associated with a shorter write time than the first write voltage pattern 730a. For example, the second write voltage pattern 730b may be considered a fast write voltage pattern relative to the first write voltage pattern 730a, and the first write voltage pattern 730a may be considered a slow write voltage pattern relative to the second write voltage pattern 730b. This may enable the memory device 120 to quickly write data to memory in a situation where the memory device 120 may lose power or will lose power. By using a fast write voltage pattern after detecting the condition, the memory device 120 increases the likelihood that pending write operations are completed (e.g., as compared to using a slow write voltage pattern), causing data to be written to non-volatile memory and retained by the memory device 120. In other words, using the fast write voltage pattern after detecting the condition decreases the likelihood of data loss due to a power loss. Details of which write voltage patterns may be considered fast write voltage patterns and which write voltage patterns may be considered slow write voltage patterns are described above in connection with FIGS. 6A-6C.

Additionally, or alternatively, the second write voltage pattern 730b may be associated with less power consumption (e.g., per write operation and/or per write operation performed on a sub-block) than the first write voltage pattern 730a. This enables the memory device 120 to perform write operations with lower power consumption after switching to the second write voltage pattern 730b, thereby potentially increasing the quantity of write operations that the memory device 120 can perform before power is lost. In some implementations, the memory device 120 may include a capacitor configured to store power for use when the memory device 120 loses power. However, the capacitor may only store a small amount of power and/or may not be capable of storing power for a long period of time, thus the use of a second write voltage pattern 730b with a fast write time and/or low power consumption may enable one or more write operations to be performed prior to power loss. Furthermore, using techniques described herein that require less power to write data to memory upon impending power loss, a capacitor of the memory device 120 can be smaller (e.g., with a reduced capacitance and/or size), thereby reducing costs to manufacture the memory device 120.

Additionally, or alternatively, the first write voltage pattern 730a may be associated with a longer life span (e.g., a higher endurance) of the memory device 120 as compared to the second write voltage pattern 730b. For example, the first write voltage pattern 730a may cause less degradation of memory cells (e.g., may be less destructive to memory cells) as compared to the second write voltage pattern 730b, such as by using a lower program voltage than the second write voltage pattern 730b (e.g., at least one program pulse of the first write voltage pattern 730a may have a lower program voltage than all program pulses included in the second write voltage pattern 730b). This may lead to a longer life span of the memory device 120 by using the first write voltage pattern 730a for default operations (e.g., when the condition associated with the power supply is not satisfied), while also preventing or reducing the likelihood of data loss by switching to the second write voltage pattern 730b when a power loss is likely to occur.

In some implementations, the second write voltage pattern 730b includes a smaller number of program pulses (e.g., per sub-block to be written) than the first write voltage pattern 730a. This may result in a faster write time and/or lower power consumption for the second write voltage pattern 730b as compared to the first write voltage pattern 730a. For example, the first write voltage pattern 730a may include two program pulses per sub-block write (e.g., the 2P1V write voltage pattern), and the second write voltage pattern 730b may include only a single program pulse per sub-block write (e.g., the 1P1V write voltage pattern, the 1P0V write voltage pattern, the 4P1V write voltage pattern, the 4P0V write voltage pattern, or the parallel programming write voltage pattern).

Additionally, or alternatively, the second write voltage pattern 730b may include a smaller number of program verify operations (e.g., per sub-block to be written) than the first write voltage pattern 730a. This may result in a faster write time and/or lower power consumption for the second write voltage pattern 730b as compared to the first write voltage pattern 730a. For example, the first write voltage pattern 730a may include one program verify operation (e.g., the 2P1V write voltage pattern), and the second write voltage pattern 730b may include zero program verify (e.g., the 1P0V write voltage pattern or the 4P0V write voltage pattern). Additionally, or alternatively, the first write voltage pattern 730a may include a program verify operation that is specific to a single sub-block (e.g., the 2P1V write voltage pattern), and the second write voltage pattern 730b may include a group program verify operation that is perform concurrently on multiple sub-blocks (e.g., the 4P1V write voltage pattern or the parallel programming write voltage pattern).

In some implementations, the first write voltage pattern 730a is the 2P1V write voltage pattern that includes a first program pulse followed by a program verify operation that is followed by a second program pulse, as described above in connection with FIG. 5. In some implementations, the second write voltage pattern 730b is one of the write voltage patterns described above in connection with FIGS. 6A-6C, such as the 1P1V write voltage pattern that includes a single program pulse followed by a program verify operation, the 1P0V write voltage pattern that includes a single program pulse that is not followed by a program verify operation, the 4P1V write voltage pattern that includes four program pulses, each associated with a different sub-block of the memory device, followed by a program verify operation, the 4P0V write voltage pattern that includes four program pulses, each associated with a different sub-block of the memory device, that are not followed by a program verify operation, or the parallel programming write voltage operation that includes a first program pulse configured to write to two sub-blocks of the memory device, followed by a program verify operation, followed by a second program pulse configured to write to the two sub-blocks of the memory device.

Although the 4P1V and 4P0V write operations are described above as examples, in some implementations, the second write voltage pattern 730b may include a write voltage pattern that includes a number of program pulses other than four, such as a number of program pulses corresponding to a number of sub-blocks included in a page. Thus, the second write voltage pattern 730b may be a write voltage pattern that includes multiple program pulses, each associated with a different sub-block of the memory device, followed by a program verify operation. Alternatively, the second write voltage pattern 730b may be a write voltage pattern that includes multiple program pulses, each associated with a different sub-block of the memory device, that are not followed by a program verify operation.

In some implementations, based on switching from the first write voltage pattern 730a to the second write voltage pattern 730b (e.g., based on activating the second write mode), the memory device 120 may store an indication that a data integrity scan is to be performed. In some cases, writing data to memory 140 using the second write voltage pattern 730b may be less reliable than writing data to memory 140 using the first write voltage pattern 730a because fewer program verify operations (e.g., zero program verify operations) and/or fewer program pulses (e.g., per sub-block) may be performed using the second write voltage pattern 730b. A data integrity scan may include a data verification operation to verify the integrity of stored data (e.g., to verify that the data is not corrupt) and/or an error handling operation to correct corrupted data.

In some implementations, the memory device 120 may store, in non-volatile memory, an instruction that triggers the data integrity scan to be performed after subsequent power up of the memory device 120. In this way, if the memory device 120 loses power, then the memory device 120 can verify data, written using a less reliable write voltage pattern, after the memory device 120 is powered back on. Additionally, or alternatively, the memory device 120 may store an instruction that triggers the data integrity scan to be performed after the memory device 120 is no longer at risk of power loss, such as after the condition indicative of a power supply problem is no longer satisfied and/or after another condition (e.g., that indicates that the power supply problem no longer exists) is satisfied. In this way, once the memory device 120 is no longer at risk of losing power, the memory device 120 can verify data written using a less reliable write voltage pattern. In some implementations, the memory device 120 may store an indication of one or more memory addresses to which data was written using the second write voltage pattern 730b so that that data stored in these memory addresses can be verified later (e.g., when the data integrity scan is performed). The data integrity scan may be performed on all memory cells or only the memory cells to which data was written using the second write voltage pattern 730b (e.g., resulting in a faster data integrity scan).

Because writing data to memory using the second write voltage pattern 730b may be less reliable than writing data to the memory using the first write voltage pattern 730a, in some implementations, the memory device 120 may only use the second write voltage pattern 730b if the memory device 120 (e.g., a block to be written) is early in its lifespan and thus associated with higher reliability. For example, the memory device 120 may determine a number of program/erase (P/E) cycles associated with a memory block to which data is to be written in connection with the one or more pending write operations. If the number of P/E cycles is less than or equal to a threshold (e.g., 60,000 P/E cycles), indicating that the memory block is earlier in its lifespan, then the memory device 120 may switch from the first write voltage pattern 730a to the second write voltage pattern 730b (e.g., may activate the second write mode) to perform the one or more pending write operations. If the number of P/E cycles is greater than (or equal to) the threshold, indicating that the memory block is later in its lifespan, then the memory device 120 may refrain from switching from the first write voltage pattern 730a to the second write voltage pattern 730b (e.g., may refrain from activating the second write mode), and may perform the one or more pending write operations using the first write voltage pattern 730a.

As shown by reference number 740, the memory device 120 may perform at least one pending write operation using the second write voltage pattern 730b. For example, after switching to the second write voltage pattern 730b, the memory device 120 may use the second write voltage pattern 730b to perform at least one write operation of the detected one or more pending write operations. In other words, the memory device 120 may use the second write voltage pattern 730b to execute one or more queued write operations based on activating a second write mode, in which the second write voltage pattern 730b is used to write data to the memory device 120, and/or based on deactivating a first write mode in which the first write voltage pattern 730a is used to write data to the memory device 120. Ideally, the memory device 120 would perform all of the detected pending write operations, but in some cases, the memory device 120 may lose power before being able to perform all of the detected pending write operations.

In some implementations, the memory device 120 may detect that the condition (e.g., a first condition) associated with power supplied to the memory device 120 (e.g., indicative of a power supply problem and/or an upcoming power loss) is no longer satisfied. Additionally, or alternatively, the memory device 120 may detect that another condition (e.g., a second condition), indicative of a stable power supply (e.g., no power supply problem and/or no upcoming power loss), is satisfied. For example, after a voltage and/or current drop below a threshold, the memory device 120 may detect that the voltage and/or current has increased above the threshold. Based on detecting that the first condition is no longer satisfied and/or that the second condition is satisfied, the memory device 120 may switch from using the second write voltage pattern 730b to using the first write voltage pattern 730a. In other words, the memory device 120 may activate the first write mode and/or may deactivate the second write mode based on determining that the first condition is no longer satisfied and/or based on determining that the second condition is satisfied. The memory device 120 may then use the first write voltage pattern 730a for subsequent write operations.

Although maintaining and using multiple write voltage patterns and selecting a write voltage pattern to use under different conditions may increase system complexity, the operations described herein enable the memory device 120 to write data to memory using faster write times and/or lower power consumption when the memory device 120 is at risk of losing power, which can prevent data loss and/or lead to less data loss than if the memory device 120 were to continue to write data to memory using slower write times and/or higher power consumption. Furthermore, the lifespan of the memory device 120 can be extended by using faster write and/or lower power consumption write operations only when the memory device 120 is at risk of losing power, and by using slower write times and/or higher power consumption write operations that are associated with higher endurance and a longer lifespan for the memory device 120 when the memory device 120 is not at risk of losing power (e.g., in a default operating mode).

As indicated above, FIG. 7 is provided as an example. Other examples may differ from what is described with regard to FIG. 7.

FIG. 8 is a flowchart of an example method 800 associated with enabling a fast write mode to mitigate power loss. In some implementations, a memory device (e.g., memory device 120) may perform or may be configured to perform one or more process blocks of FIG. 8. In some implementations, another device or a group of devices separate from or including the memory device may perform or may be configured to perform one or more process blocks of FIG. 8. Additionally, or alternatively, one or more components of the memory device (e.g., controller 130, memory management component 250, condition detection component 260, voltage pattern switching component 270, and/or command execution component 280) may perform or may be configured to perform one or more process blocks of FIG. 8.

As shown in FIG. 8, the method 800 may include detecting a condition associated with power supplied to a memory device (block 810). As further shown in FIG. 8, the method 800 may include detecting one or more pending write operations to be performed to cause data to be written to memory cells of the memory device (block 820). As further shown in FIG. 8, the method 800 may include switching from a first voltage pattern, previously used by the memory device to write data to one or more memory cells of the memory device, to a second voltage pattern based on detecting the condition and based on detecting the one or more pending write operations (block 830). As further shown in FIG. 8, the method 800 may include performing at least one write operation, of the one or more pending write operations, using the second voltage pattern (block 840).

Although FIG. 8 shows example blocks of a method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. The method 800 is an example of one method that may be performed by one or more devices described herein. These one or more devices may perform or may be configured to perform one or more other methods based on operations described herein, such as the operations described in connection with FIG. 7.

FIG. 9 is a flowchart of an example method 900 associated with enabling a fast write mode to mitigate power loss. In some implementations, a memory device (e.g., memory device 120) may perform or may be configured to perform one or more process blocks of FIG. 9. In some implementations, another device or a group of devices separate from or including the memory device may perform or may be configured to perform one or more process blocks of FIG. 9. Additionally, or alternatively, one or more components of the memory device (e.g., controller 130, memory management component 250, condition detection component 260, voltage pattern switching component 270, and/or command execution component 280) may perform or may be configured to perform one or more process blocks of FIG. 9.

As shown in FIG. 9, the method 900 may include detecting a condition indicative of a power supply problem associated with power supplied to a memory device (block 910). As further shown in FIG. 9, the method 900 may include activating a fast write mode that uses a fast write voltage pattern to write data to the memory device based on detecting the condition indicative of the power supply problem (block 920). As further shown in FIG. 9, the method 900 may include executing one or more queued write operations using the fast write mode based on activating the fast write mode (block 930).

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein, such as the operations described in connection with FIG. 7.

Figure 10:
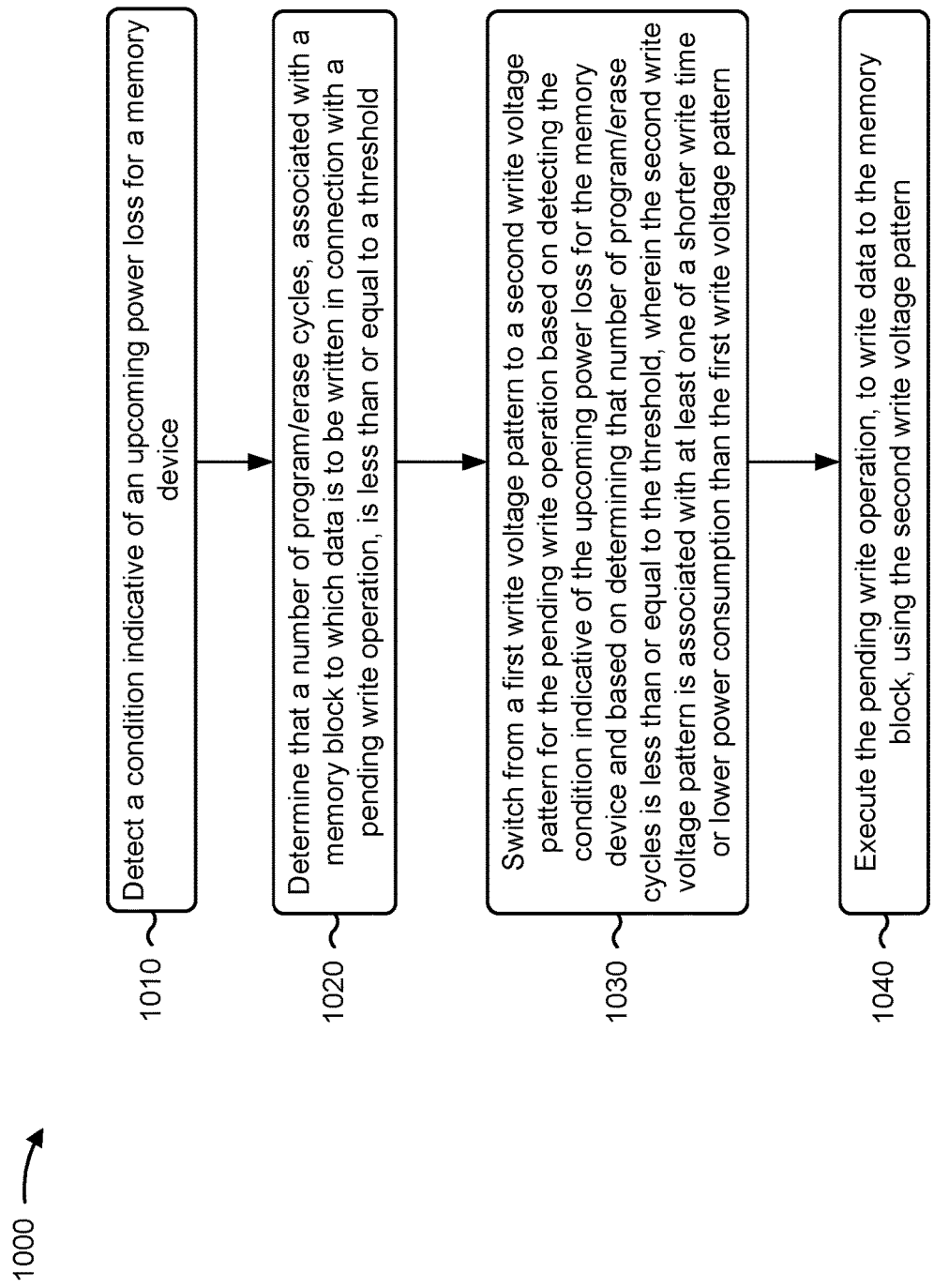

FIG. 10 is a flowchart of an example method 1000 associated with enabling a fast write mode to mitigate power loss. In some implementations, a memory device (e.g., memory device 120) may perform or may be configured to perform one or more process blocks of FIG. 10. In some implementations, another device or a group of devices separate from or including the memory device may perform or may be configured to perform one or more process blocks of FIG. 10. Additionally, or alternatively, one or more components of the memory device (e.g., controller 130, memory management component 250, condition detection component 260, voltage pattern switching component 270, and/or command execution component 280) may perform or may be configured to perform one or more process blocks of FIG. 10.

As shown in FIG. 10, the method 1000 may include detecting a condition indicative of an upcoming power loss for a memory device (block 1010). As further shown in FIG. 10, the method 1000 may include determining that a number of program/erase cycles, associated with a memory block to which data is to be written in connection with a pending write operation, is less than or equal to a threshold (block 1020). As further shown in FIG. 10, the method 1000 may include switching from a first write voltage pattern to a second write voltage pattern for the pending write operation based on detecting the condition indicative of the upcoming power loss for the memory device and based on determining that the number of program/erase cycles is less than or equal to the threshold, wherein the second write voltage pattern is associated with at least one of a shorter write time or lower power consumption than the first write voltage pattern (block 1030). As further shown in FIG. 10, the method 1000 may include executing the pending write operation, to write data to the memory block, using the second write voltage pattern (block 1040).

Although FIG. 10 shows example blocks of a method 1000, in some implementations, the method 1000 may include additional blocks, fewer blocks, different blocks, or differently arranged blocks than those depicted in FIG. 10. Additionally, or alternatively, two or more of the blocks of the method 1000 may be performed in parallel. The method 1000 is an example of one method that may be performed by one or more devices described herein. These one or more devices may perform or may be configured to perform one or more other methods based on operations described herein, such as the operations described in connection with FIG. 7.

In some implementations, a memory device includes one or more components configured to: detect a condition associated with power supplied to the memory device; detect one or more pending write operations to be performed to cause data to be written to memory cells of the memory device; switch from a first voltage pattern, previously used by the memory device to write data to one or more memory cells of the memory device, to a second voltage pattern based on detecting the condition and based on detecting the one or more pending write operations; and perform at least one write operation, of the one or more pending write operations, using the second voltage pattern.

In some implementations, a method includes detecting, by a memory device, a condition indicative of a power supply problem associated with power supplied to the memory device; activating, by the memory device, a fast write mode that uses a fast write voltage pattern to write data to the memory device based on detecting the condition indicative of the power supply problem; and executing, by the memory device, one or more queued write operations using the fast write mode based on activating the fast write mode.

In some implementations, a memory device includes means for detecting a condition indicative of an upcoming power loss for the memory device; means for determining that a number of program/erase cycles, associated with a memory block to which data is to be written in connection with a pending write operation, is less than or equal to a threshold; means for switching from a first write voltage pattern to a second write voltage pattern for the pending write operation based on detecting the condition indicative of the upcoming power loss for the memory device and based on determining that the number of program/erase cycles is less than or equal to the threshold, wherein the second write voltage pattern is associated with at least one of a shorter write time or lower power consumption than the first write voltage pattern; and means for executing the pending write operation, to write data to the memory block, using the second write voltage pattern.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   one or more components configured to:
      detect a condition associated with power supplied to the memory device;
      detect one or more pending write operations to be performed to cause data to be written to memory cells of the memory device;
      determine that a number of program/erase cycles, associated with a memory block to which data is to be written in connection with the one or more pending write operations, is less than or equal to a threshold;
      switch from a first voltage pattern, previously used by the memory device to write data to one or more memory cells of the memory device, to a second voltage pattern based on:
         detecting the condition,
         detecting the one or more pending write operations, and
         determining that the number of program/erase cycles is less than or equal to the threshold; and
      perform at least one write operation, of the one or more pending write operations, using the second voltage pattern.

2. The memory device of claim 1, wherein the second voltage pattern is associated with a shorter write time than the first voltage pattern.

3. The memory device of claim 1, wherein the second voltage pattern is associated with less power consumption than the first voltage pattern.

4. The memory device of claim 1, wherein the first voltage pattern is associated with a longer life span of the memory device as compared to the second voltage pattern.

5. The memory device of claim 1, wherein the second voltage pattern includes a smaller number of program pulses than the first voltage pattern.

6. The memory device of claim 1, wherein the second voltage pattern includes a smaller number of program verify operations than the first voltage pattern.

7. The memory device of claim 1, wherein the first voltage pattern includes a first program pulse, followed by a program verify operation, followed by a second program pulse.

8. The memory device of claim 7, wherein the second voltage pattern includes only a single program pulse.

9. The memory device of claim 7, wherein the second voltage pattern includes one of:
- a single program pulse followed by a program verify operation,
- a single program pulse that is not followed by a program verify operation,
- multiple program pulses, each associated with a different sub-block of the memory device, followed by a program verify operation,
- multiple program pulses, each associated with a different sub-block of the memory device, that are not followed by a program verify operation, or
- a first program pulse configured to write to two sub-blocks of the memory device, followed by a program verify operation, followed by a second program pulse configured to write to the two sub-blocks of the memory device.

10. A method, comprising:
- detecting, by a memory device, a condition indicative of a power supply problem associated with power supplied to the memory device;
- determining that a number of program/erase cycles, associated with a memory block to which data is to be written in connection with one or more queued write operations, is less than or equal to a threshold;
- activating, by the memory device, a fast write mode that uses a fast write voltage pattern to write data to the memory device based on detecting the condition indicative of the power supply problem and based on determining that the number of program/erase cycles is less than or equal to the threshold; and
- executing, by the memory device, the one or more queued write operations using the fast write mode based on activating the fast write mode.

11. The method of claim 10, further comprising deactivating a slow write mode that uses a slow write voltage pattern to write data to the memory device based on detecting the condition indicative of the power supply problem,
wherein the fast write voltage pattern is configured to write data to the memory device faster than the slow write voltage pattern.

12. The method of claim 11, wherein the slow write voltage pattern is less destructive to memory cells of the memory device than the fast write voltage pattern.

13. The method of claim 11, wherein the fast write voltage pattern uses a smaller number of program pulses, per sub-block to be written, than the slow write voltage pattern.

14. The method of claim 11, wherein the slow write voltage pattern includes a first program pulse, followed by a program verify operation, followed by a second program pulse, and
wherein the fast write voltage pattern includes one of:
- a single program pulse followed by a program verify operation,
- a single program pulse that is not followed by a program verify operation,
- multiple program pulses, each associated with a different sub-block of the memory device, followed by a program verify operation,
- multiple program pulses, each associated with a different sub-block of the memory device, that are not followed by a program verify operation, or
- a first program pulse configured to write to two sub-blocks of the memory device, followed by a program verify operation, followed by a second program pulse configured to write to two sub-blocks of the memory device.

15. The method of claim 10, wherein the one or more queued write operations are one or more queued single-level cell (SLC) write operations to write data to SLC memory cells;
wherein the method further comprises determining that the one or more queued SLC write operations are queued for execution; and
wherein activating the fast write mode comprises activating the fast write mode based on determining that the one or more queued SLC write operations are queued for execution.

16. The method of claim 10, further comprising:
- detecting that the condition is no longer satisfied or that a different condition is satisfied;
- activating a slow write mode that uses a slow write voltage pattern to write data to the memory device based on detecting that the condition is no longer satisfied or that the different condition is satisfied; and
- executing one or more write operations using the slow write mode based on activating the slow write mode.

17. A memory device, comprising:
- means for detecting a condition indicative of an upcoming power loss for the memory device;
- means for determining that a number of program/erase cycles, associated with a memory block to which data is to be written in connection with a pending write operation, is less than or equal to a threshold;
- means for switching from a first write voltage pattern to a second write voltage pattern for the pending write operation based on detecting the condition indicative of the upcoming power loss for the memory device and based on determining that the number of program/erase cycles is less than or equal to the threshold,
    wherein the second write voltage pattern is associated with at least one of a shorter write time or lower power consumption than the first write voltage pattern; and
- means for executing the pending write operation, to write data to the memory block, using the second write voltage pattern.

18. The memory device of claim 17, wherein the first write voltage pattern includes at least one program pulse that has a lower program voltage than all program pulses included in the second write voltage pattern.

19. The memory device of claim 17, wherein the first write voltage pattern is associated with higher endurance for the memory device than the second write voltage pattern.

20. The memory device of claim 17, wherein the means for detecting the condition indicative of the upcoming power loss for the memory device comprises:
- means for receiving, from a host device, an indication of the upcoming power loss or an instruction for the memory device to power down, or
- means for detecting a voltage drop that satisfies a threshold.

21. The memory device of claim 17, further comprising means for storing, based on switching from the first write voltage pattern to the second write voltage pattern, an indication that a data integrity scan is to be performed.

22. The memory device of claim 17, wherein the first write voltage pattern includes a first program pulse, followed by a program verify operation, followed by a second program pulse.

23. The memory device of claim 22, wherein the second write voltage pattern includes only a single program pulse.

24. The memory device of claim 22, wherein the second write voltage pattern includes one of:
- a single program pulse followed by a program verify operation,
- a single program pulse that is not followed by a program verify operation,
- multiple program pulses, each associated with a different sub-block of the memory device, followed by a program verify operation,
- multiple program pulses, each associated with a different sub-block of the memory device, that are not followed by a program verify operation, or
- a first program pulse configured to write to two sub-blocks of the memory device, followed by a program verify operation, followed by a second program pulse configured to write to two sub-blocks of the memory device.

25. The method of claim 11, wherein the fast write voltage pattern is associated with less power consumption than the slow write voltage pattern.

\* \* \* \* \*